(12) United States Patent
Seo

(10) Patent No.: US 10,319,721 B2
(45) Date of Patent: Jun. 11, 2019

(54) SPACER FOR DUAL EPI CMOS DEVICES

(71) Applicant: INTERNATIONAL BUSINESS MACHINES CORPORATION, Armonk, NY (US)

(72) Inventor: Soon-Cheon Seo, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/166,560

(22) Filed: May 27, 2016

(65) Prior Publication Data
US 2017/0170179 A1    Jun. 15, 2017

Related U.S. Application Data

(62) Division of application No. 14/966,495, filed on Dec. 11, 2015, now Pat. No. 9,553,093.

(51) Int. Cl.
*H01L 21/02*      (2006.01)
*H01L 21/84*      (2006.01)
(Continued)

(52) U.S. Cl.
CPC .... *H01L 27/0924* (2013.01); *H01L 21/02126* (2013.01); *H01L 21/31116* (2013.01); *H01L 21/823814* (2013.01); *H01L 21/823821* (2013.01); *H01L 21/823864* (2013.01); *H01L 21/845* (2013.01)

(58) Field of Classification Search
CPC ..... H01L 21/823412; H01L 21/823425; H01L 21/823475
See application file for complete search history.

(56) References Cited

U.S. PATENT DOCUMENTS 9,287,382 B1 * 3/2016 Lee ........................ H01L 21/845
9,324,623 B1 * 4/2016 Kim ................ H01L 21/823814
(Continued)

OTHER PUBLICATIONS

List of IBM Patents or Patent Applictions Treated as Related; (Appendix P), Date Filed: Dec. 5, 2016; 2 pages.
(Continued)

*Primary Examiner* — Nishath Yasmeen
(74) *Attorney, Agent, or Firm* — Cantor Colburn LLP; Steven Meyers

(57) ABSTRACT

Aspects of the disclosure include a method for making a semiconductor, including patterning a first transistor having one or more gate stacks on a first source-drain area and second transistor comprising one or more gate stacks on a second source-drain area, forming dielectric spacers on gate stack side walls, depositing a first nitride liner on the first and second transistors. The method also includes masking the second transistor and etching to remove the first nitride material and the spacer from the first source-drain area and growing a first epitaxial layer on the first source-drain area by an epitaxial growth process. The method also includes depositing a second nitride liner on the first and second transistors. The method also includes masking the first transistor. The method also includes etching to remove the second nitride material from the second source-drain area and growing a second epitaxial layer on the second source-drain area by an epitaxial growth process.

4 Claims, 28 Drawing Sheets

(51) Int. Cl.
*H01L 21/311* (2006.01)
*H01L 27/092* (2006.01)
*H01L 21/8238* (2006.01)

(56) References Cited

U.S. PATENT DOCUMENTS

| | | | | |
|---|---|---|---|---|
| 2006/0131656 A1* | 6/2006 | Shin | ..................... | H01L 21/265 257/369 |
| 2007/0082492 A1* | 4/2007 | Kim | ..................... | H01L 21/318 438/694 |
| 2009/0191679 A1* | 7/2009 | Ouyang | .......... | H01L 21/823807 438/276 |
| 2010/0164000 A1* | 7/2010 | Dove | ............. | H01L 21/823412 257/368 |
| 2011/0074498 A1* | 3/2011 | Thompson | ...... | H01L 21/823807 438/276 |
| 2011/0309333 A1* | 12/2011 | Cheng | ................... | B82Y 10/00 257/24 |
| 2014/0284719 A1* | 9/2014 | Khakifirooz | .......... | H01L 21/845 257/351 |

OTHER PUBLICATIONS

U.S. Appl. No. 15/297,730, filed Oct. 19, 2016; Entitled: Spacer for Dual epi CMOS Devices.
List of IBM Patents or Patent Applictions Treated as Related; (Appendix P); Date Filed—Aug. 30, 2016, 2 pages.
U.S. Appl. No. 14/966,495, filed Dec. 11, 2015; Entitled: Spacer for Dual epi CMOS Devices.

* cited by examiner

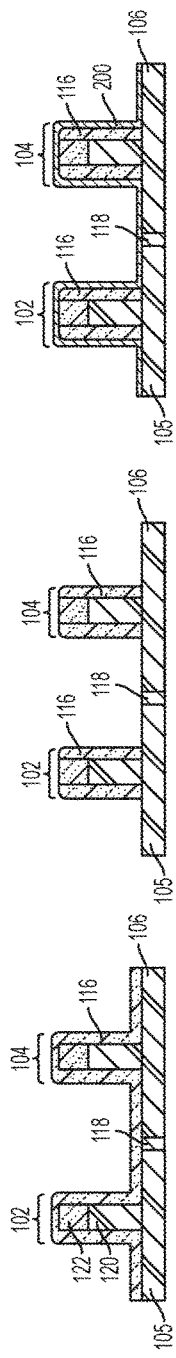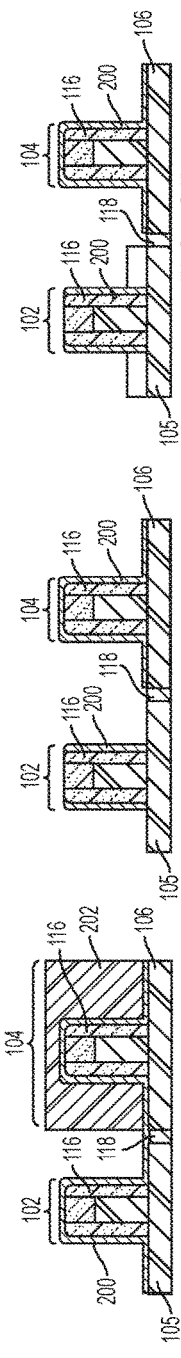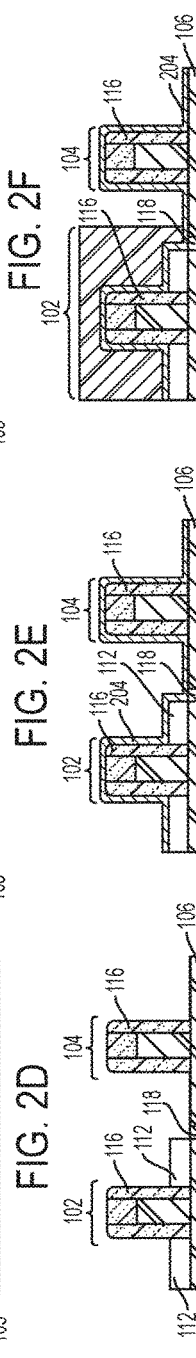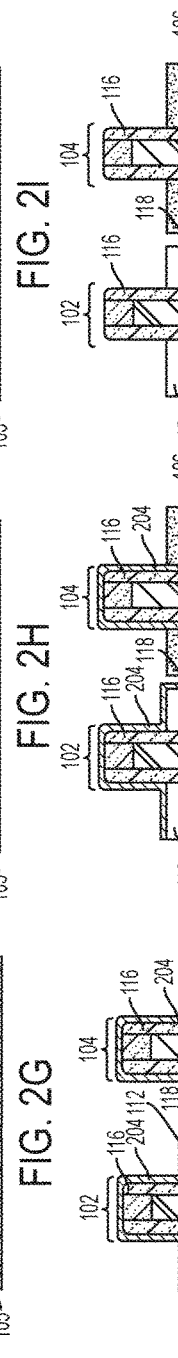

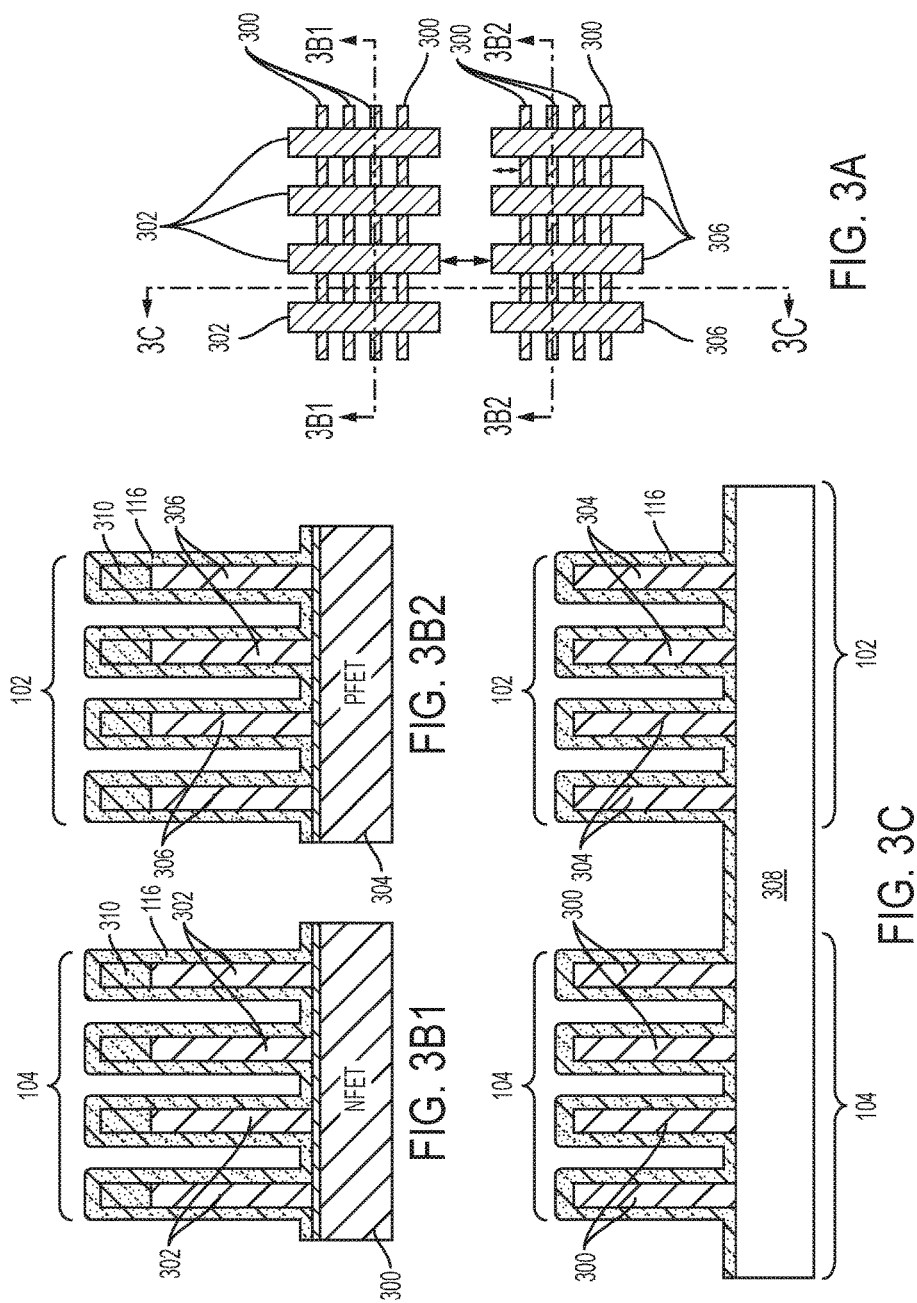

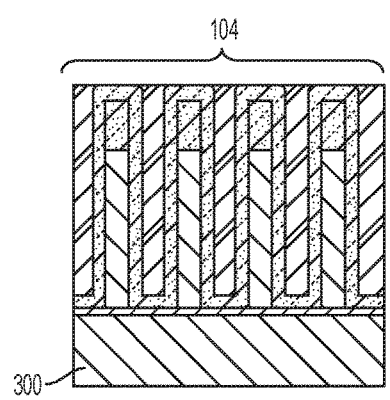
FIG. 3D1
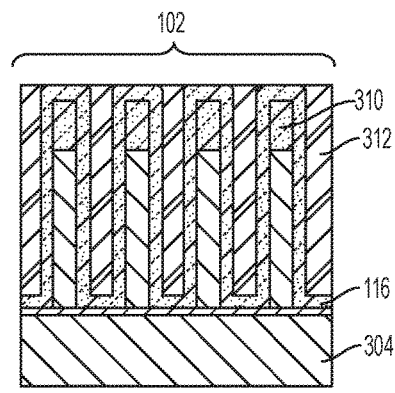
FIG. 3D2
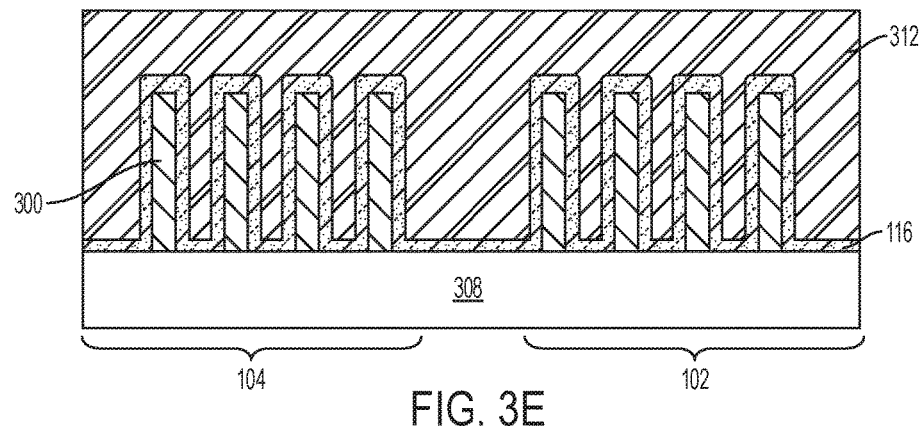
FIG. 3E

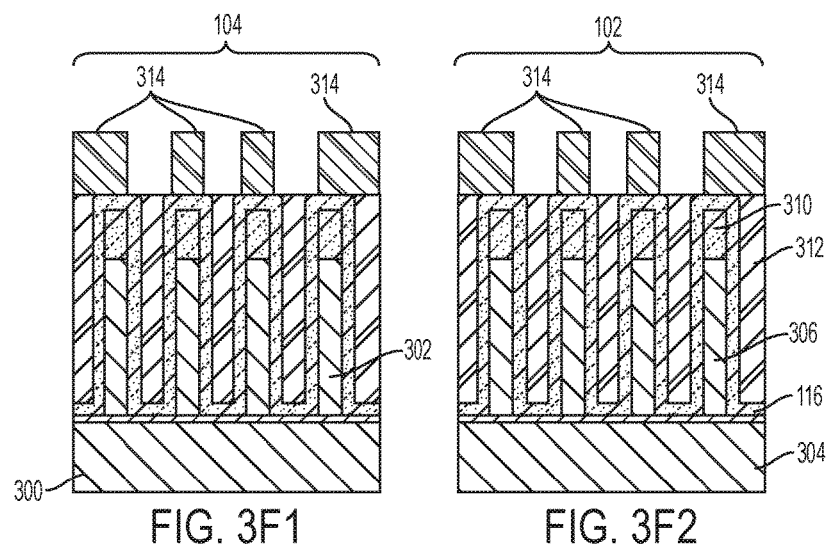
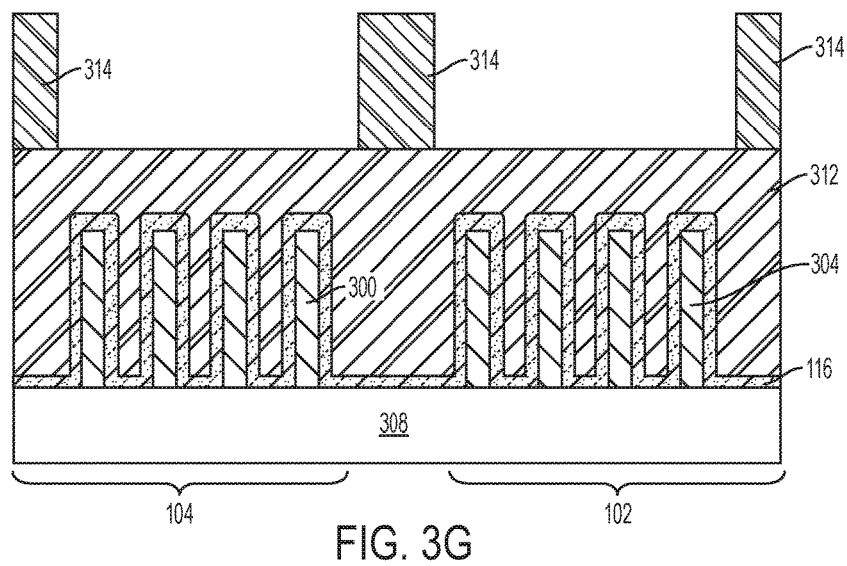

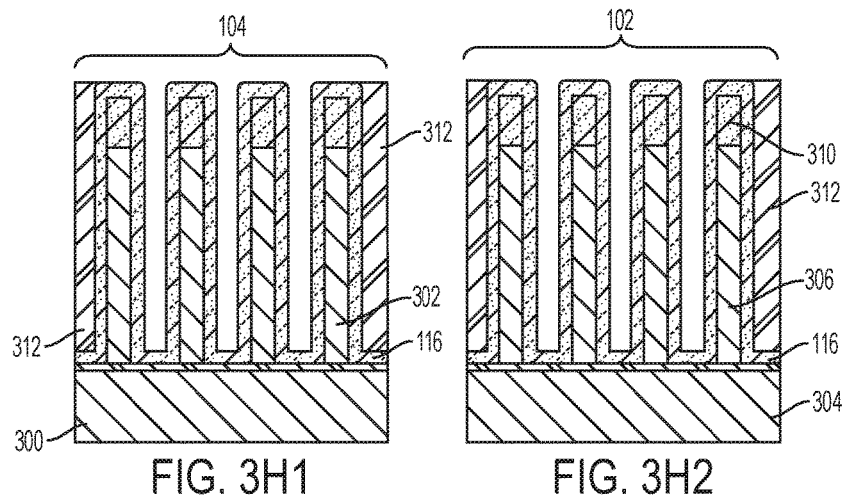
FIG. 3H1    FIG. 3H2
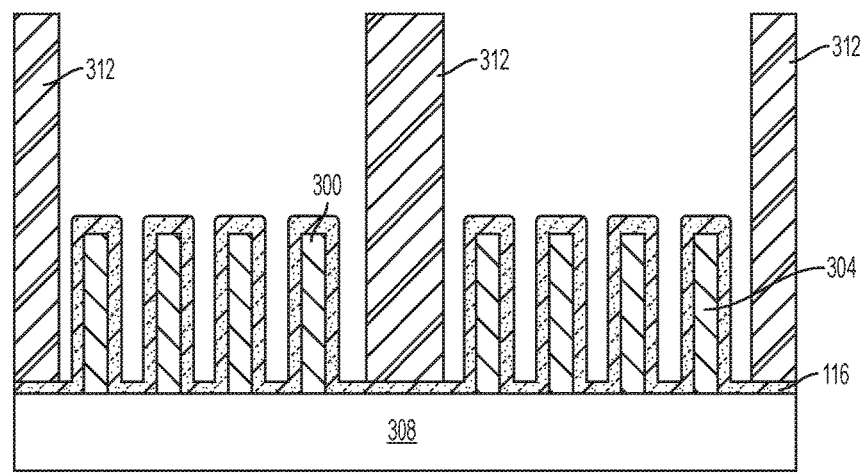
FIG. 3I

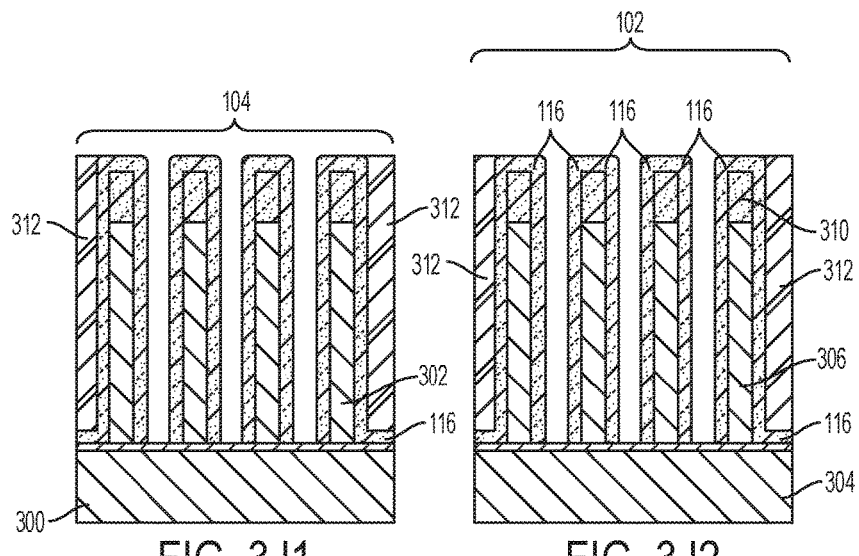
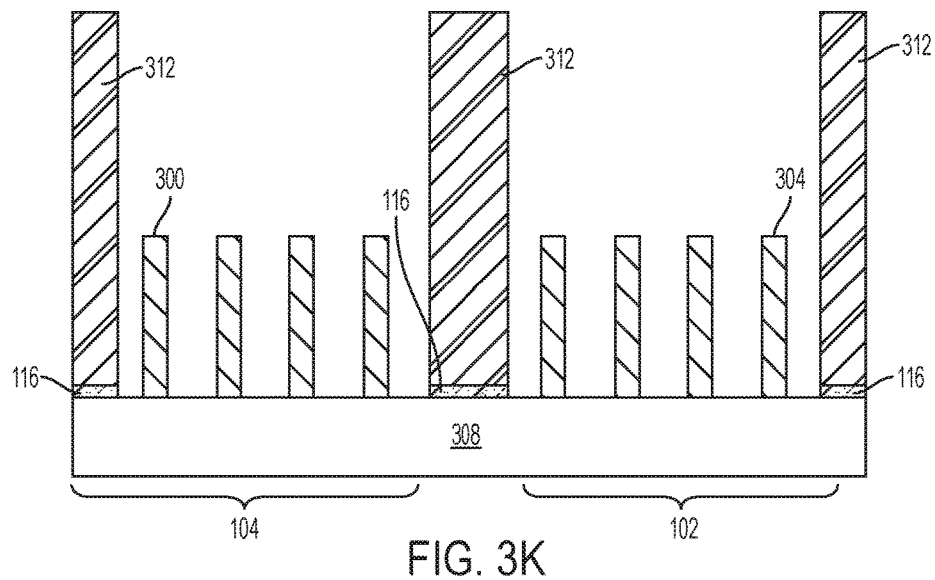

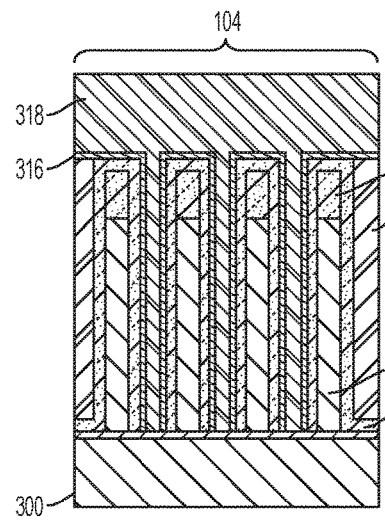
FIG. 3L1
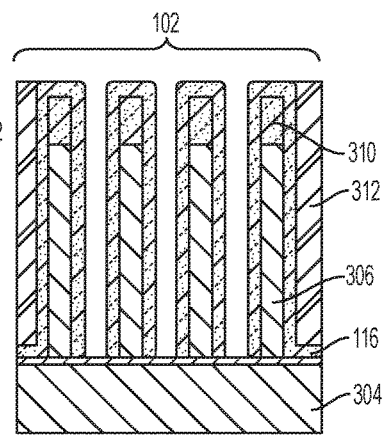
FIG. 3L2
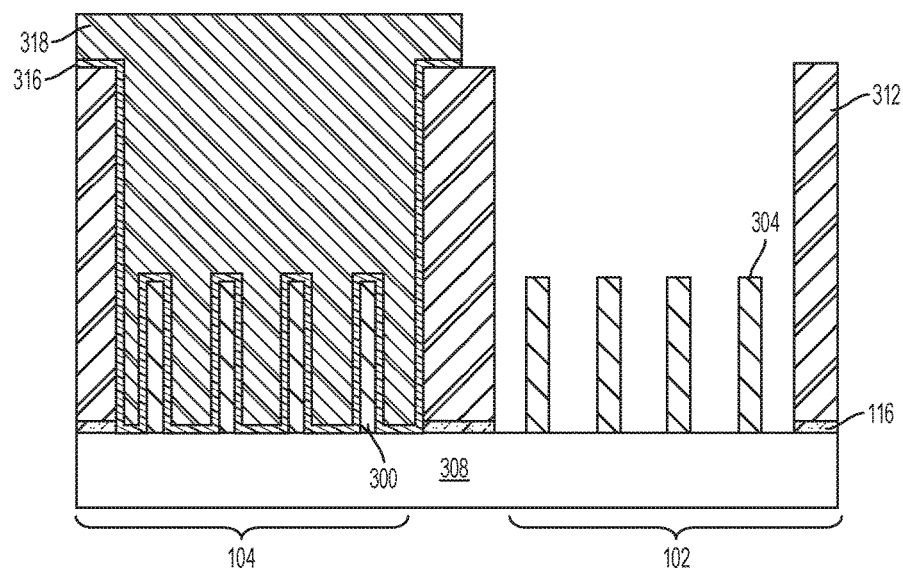
FIG. 3M

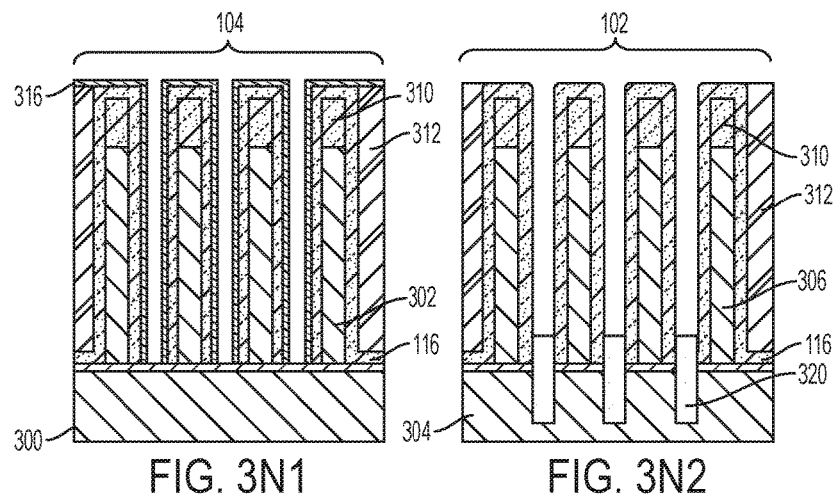
FIG. 3N1    FIG. 3N2
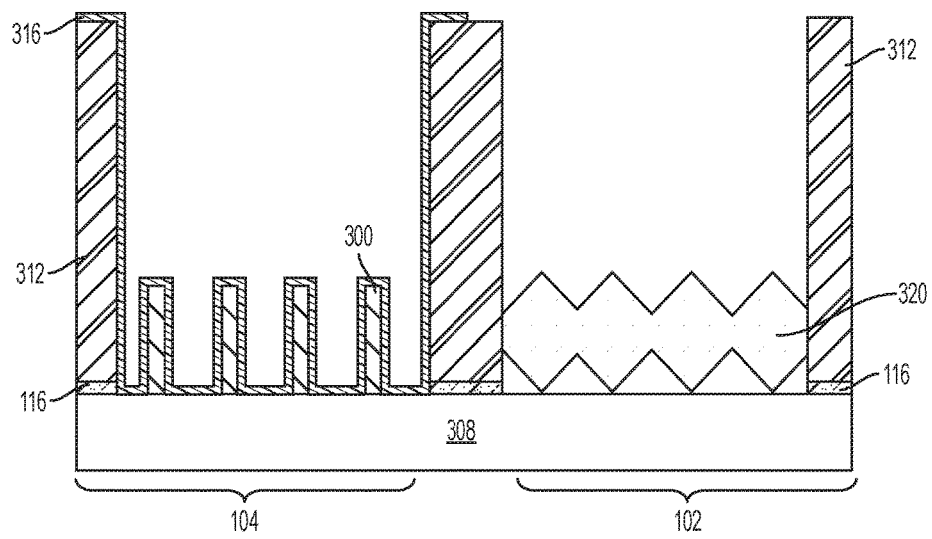
FIG. 3O

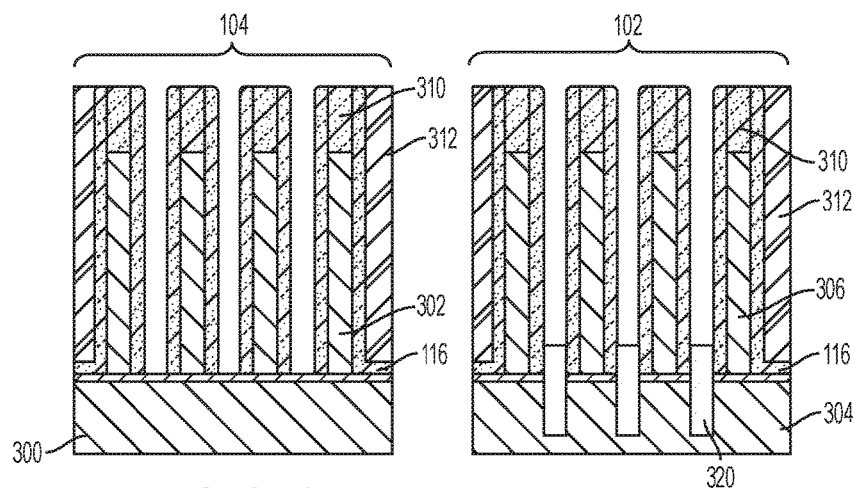
FIG. 3P1  FIG. 3P2
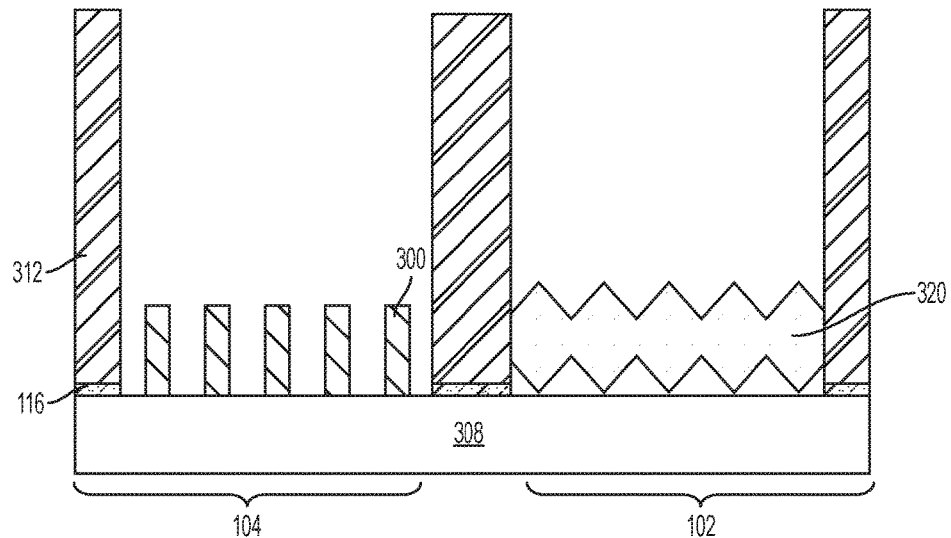
FIG. 3Q

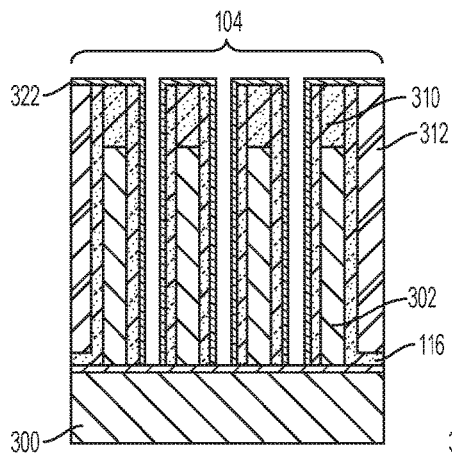
FIG. 3R1
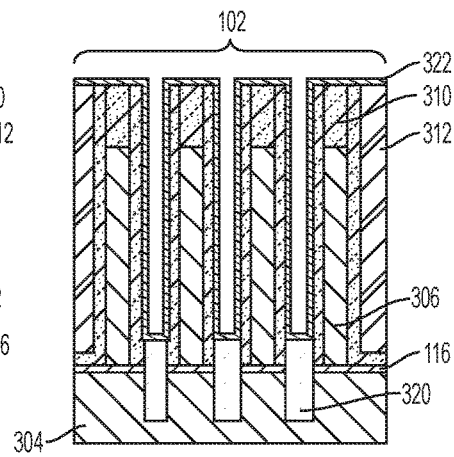
FIG. 3R2
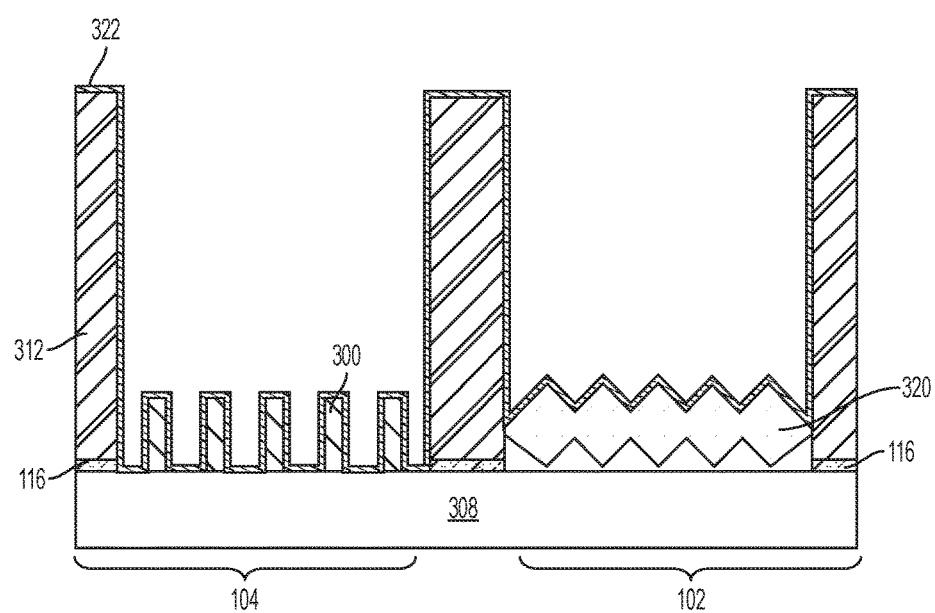
FIG. 3S

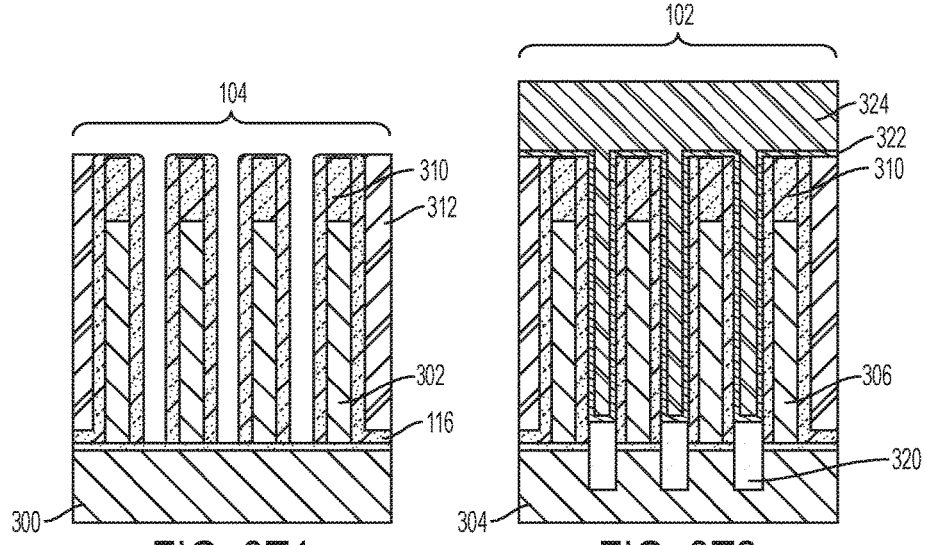
FIG. 3T1   FIG. 3T2
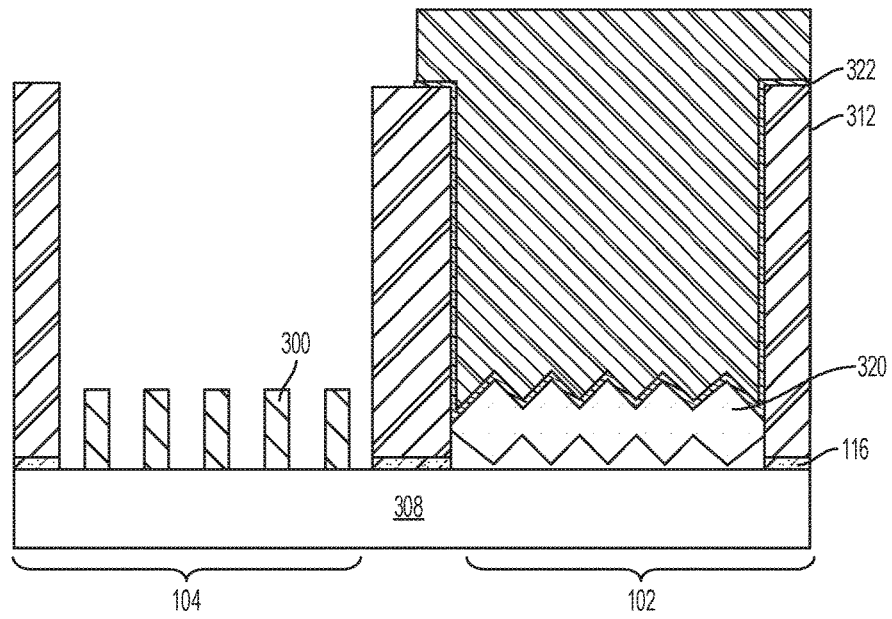
FIG. 3U

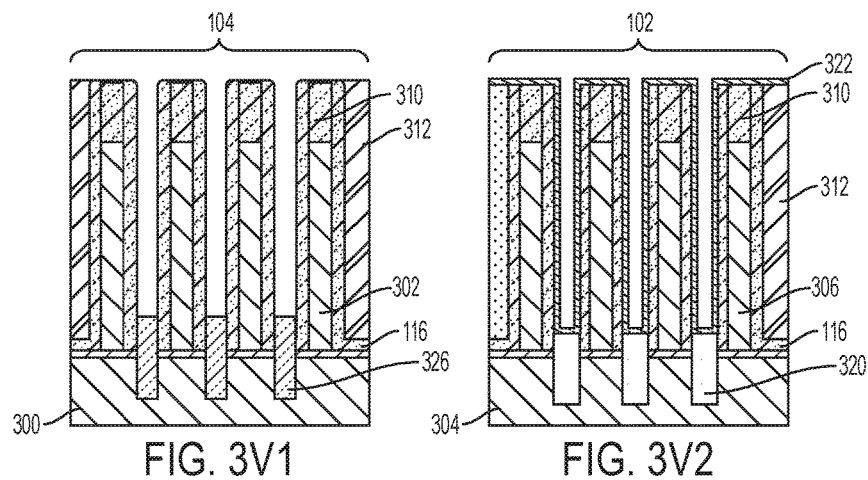
FIG. 3V1    FIG. 3V2
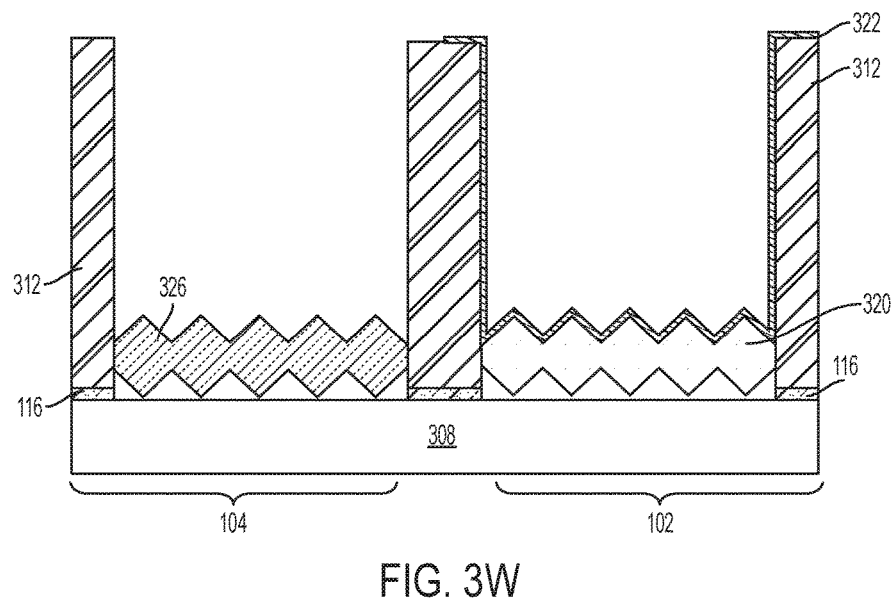
FIG. 3W

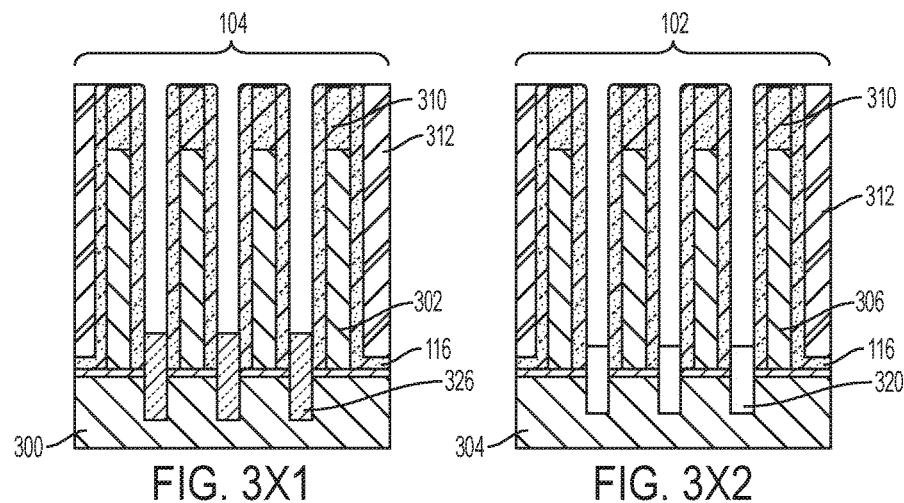
FIG. 3X1    FIG. 3X2
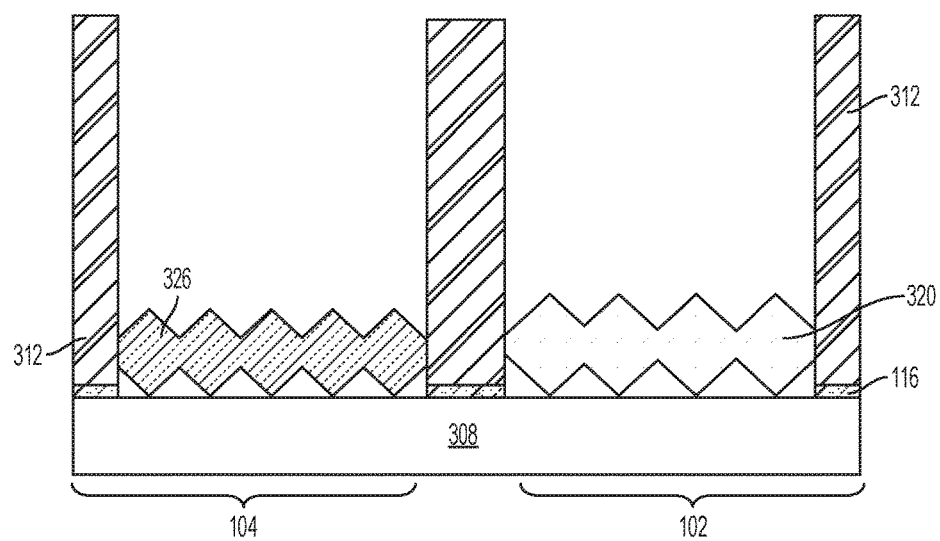
FIG. 3Y

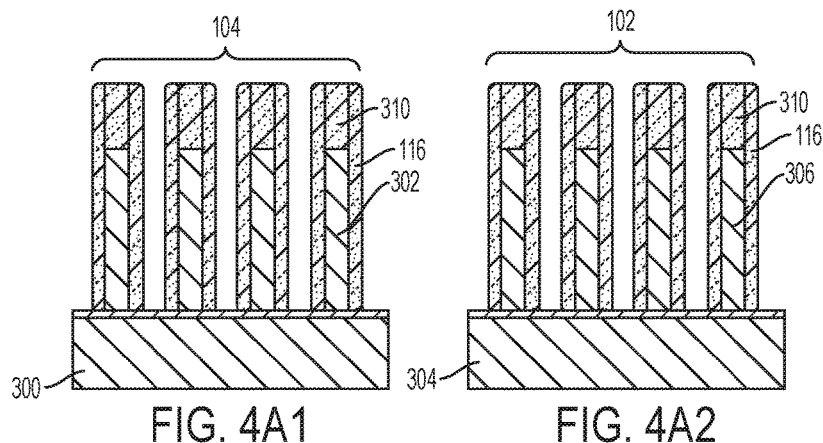
FIG. 4A1   FIG. 4A2
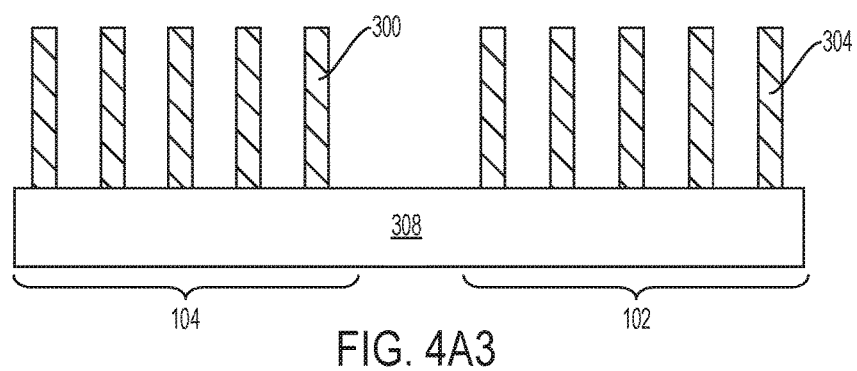
FIG. 4A3

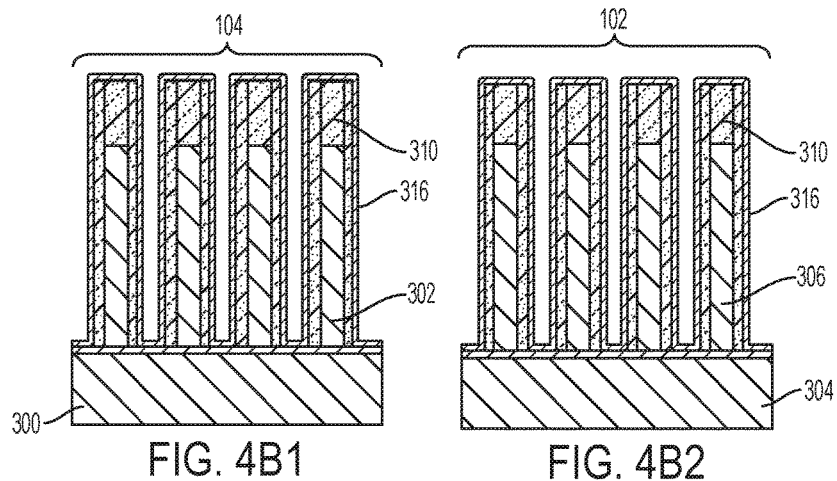
FIG. 4B1  FIG. 4B2
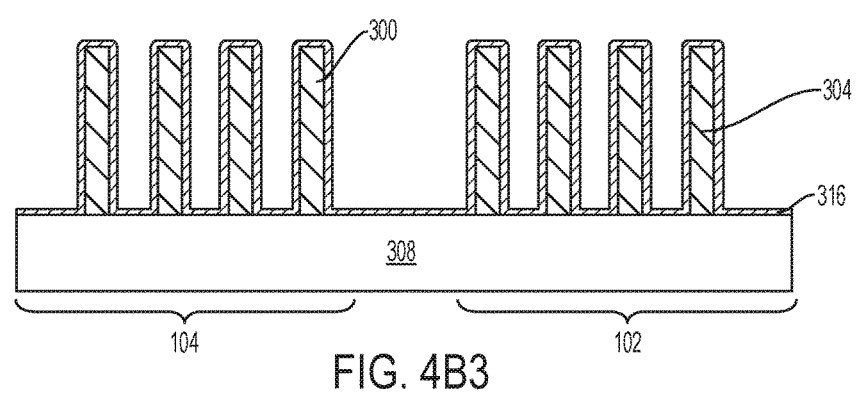
FIG. 4B3

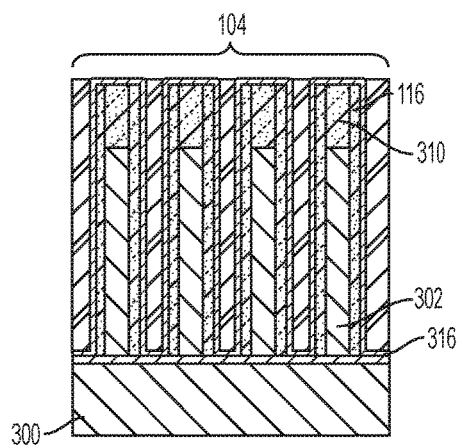
FIG. 4C1
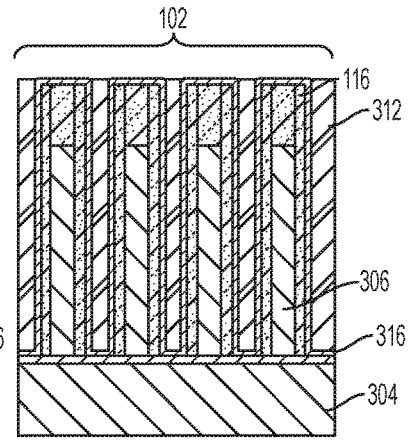
FIG. 4C2
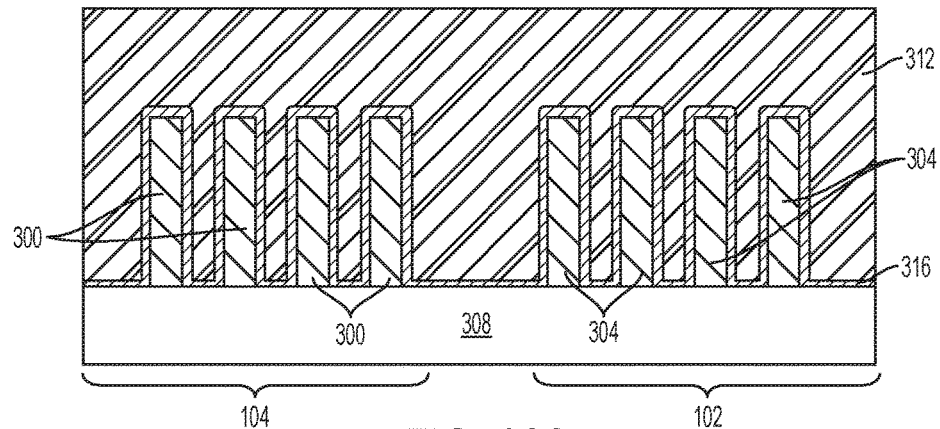
FIG. 4C3

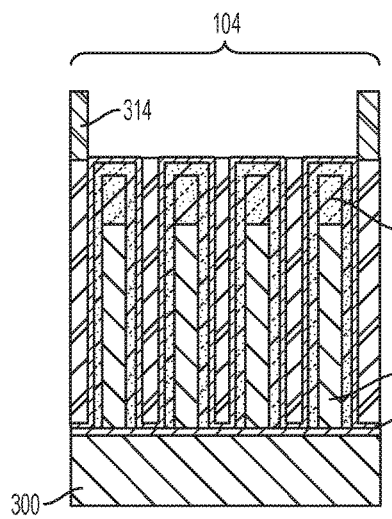
FIG. 4D1
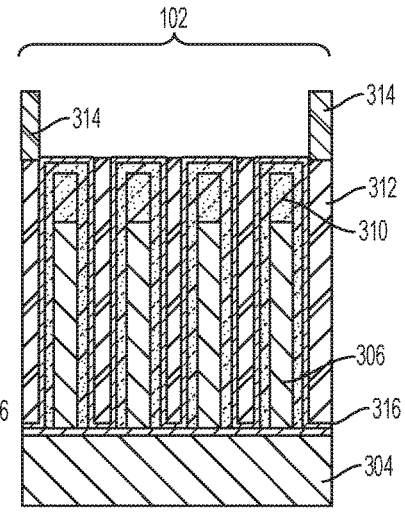
FIG. 4D2
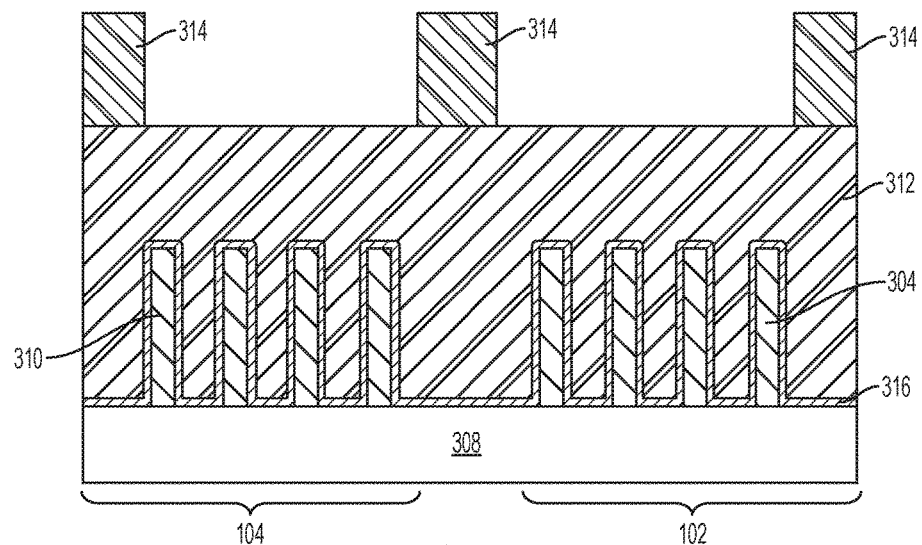
FIG. 4D3

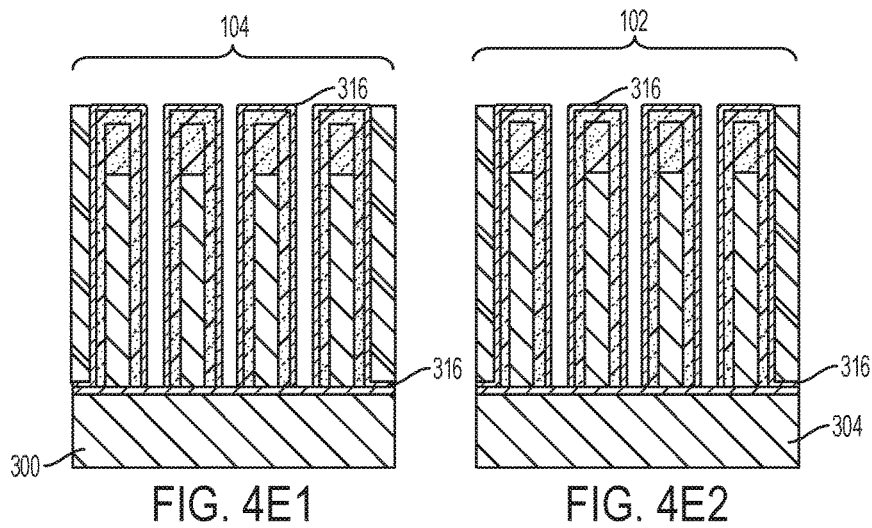
FIG. 4E1   FIG. 4E2
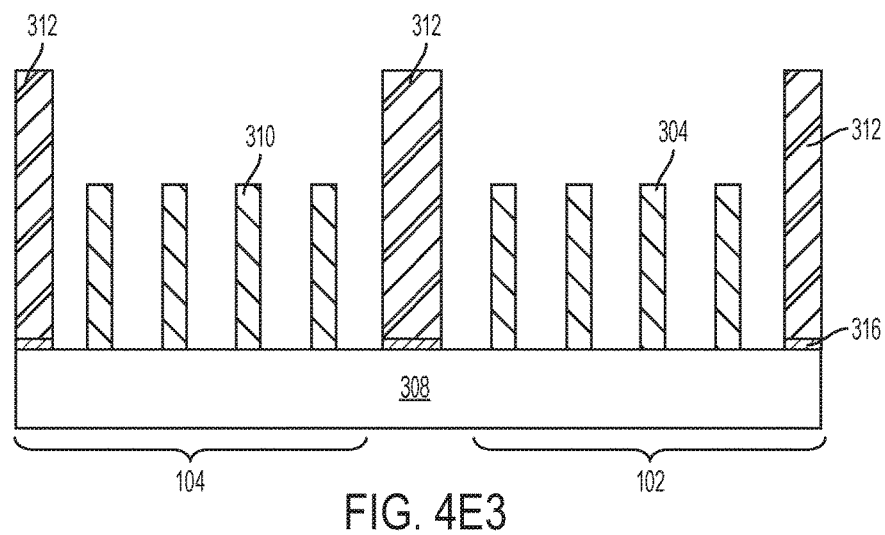
FIG. 4E3

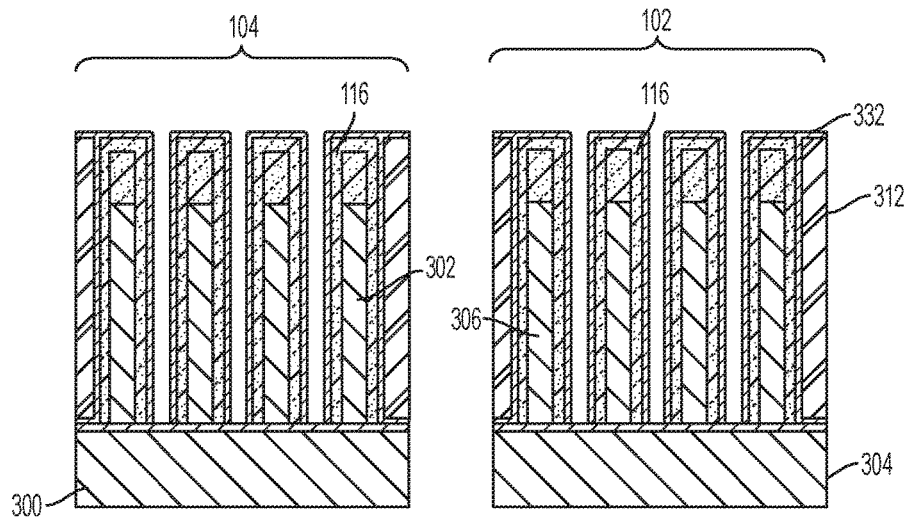
FIG. 4F1    FIG. 4F2
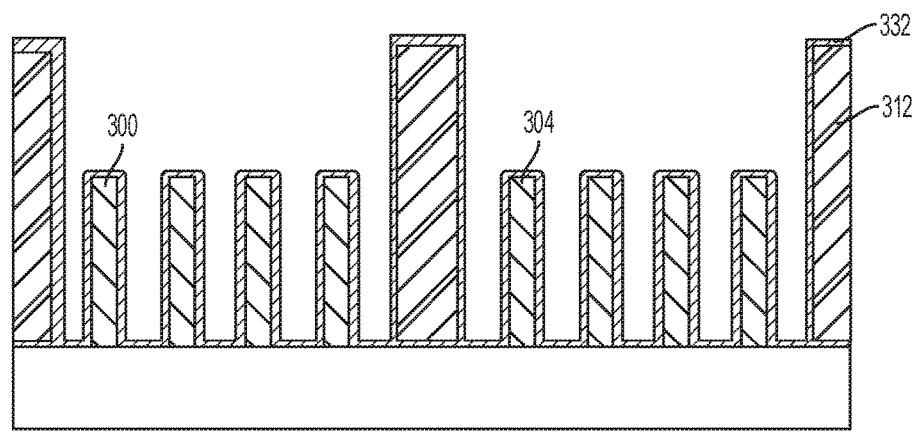
FIG. 4F3

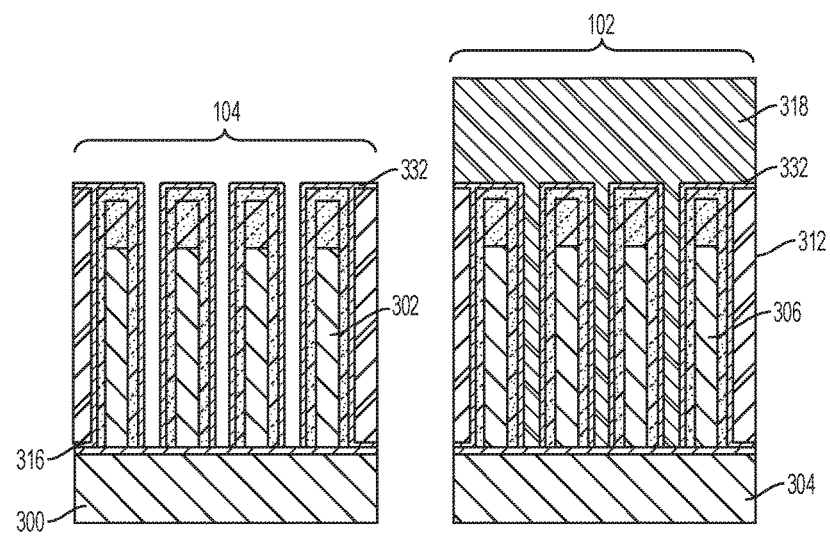
FIG. 4G1    FIG. 4G2
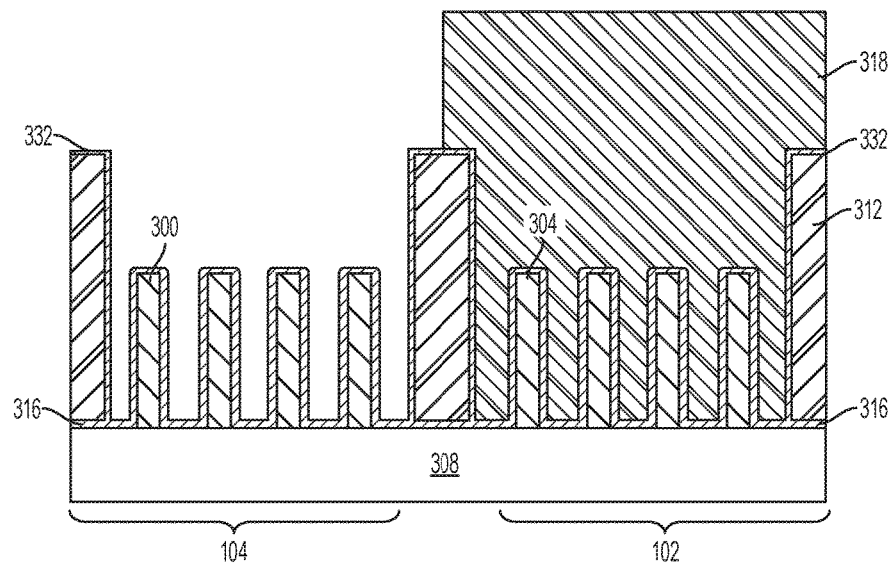
FIG. 4G3

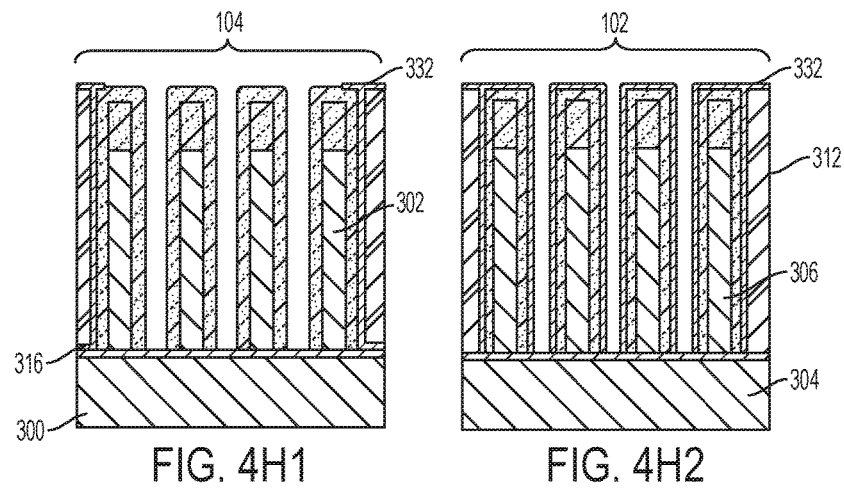
FIG. 4H1    FIG. 4H2
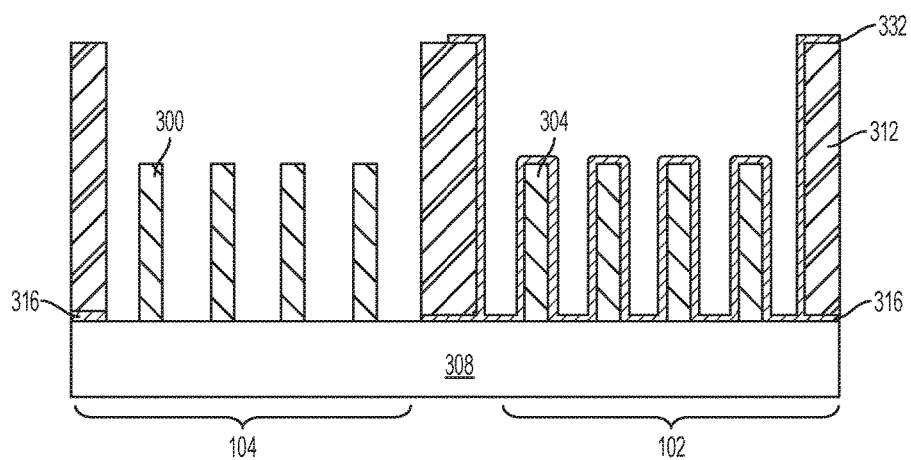
FIG. 4H3

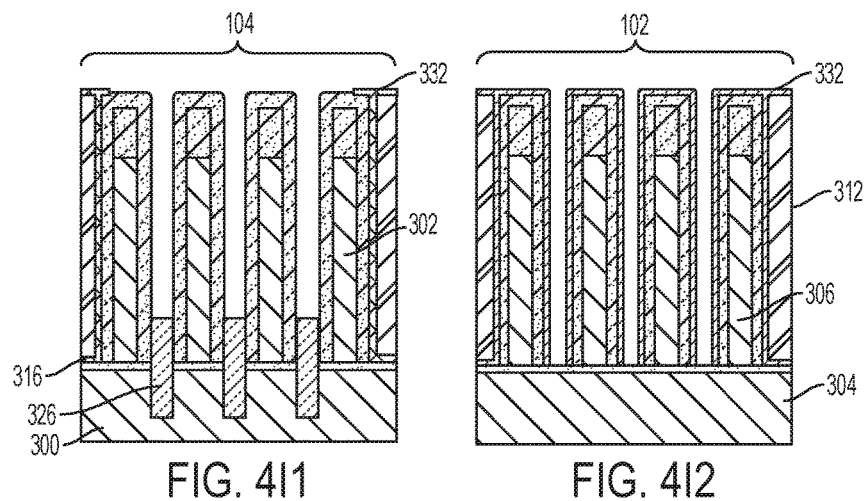
FIG. 4I1    FIG. 4I2
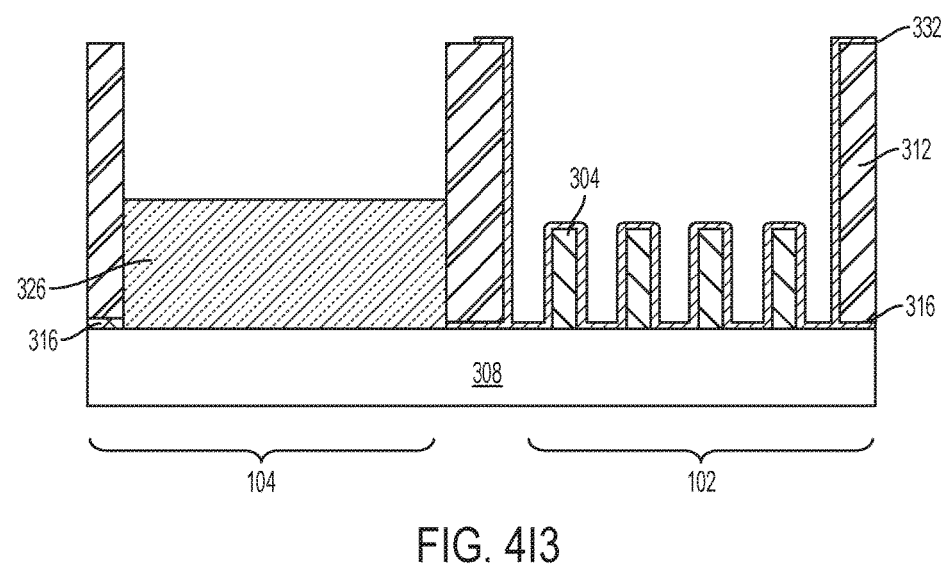
FIG. 4I3

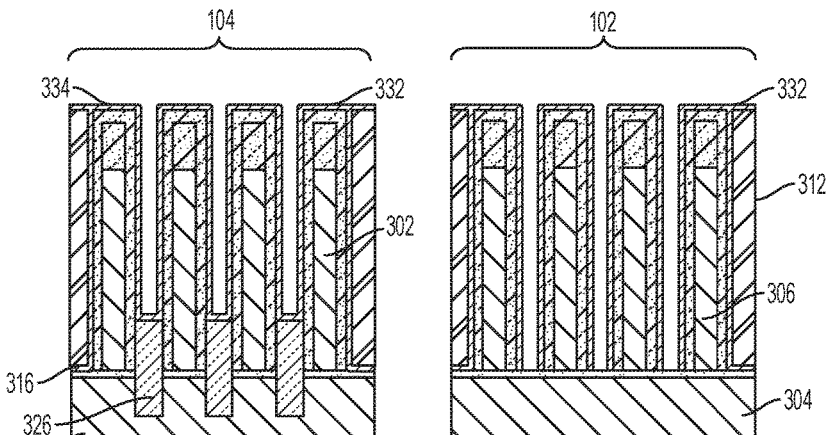
FIG. 4J1   FIG. 4J2
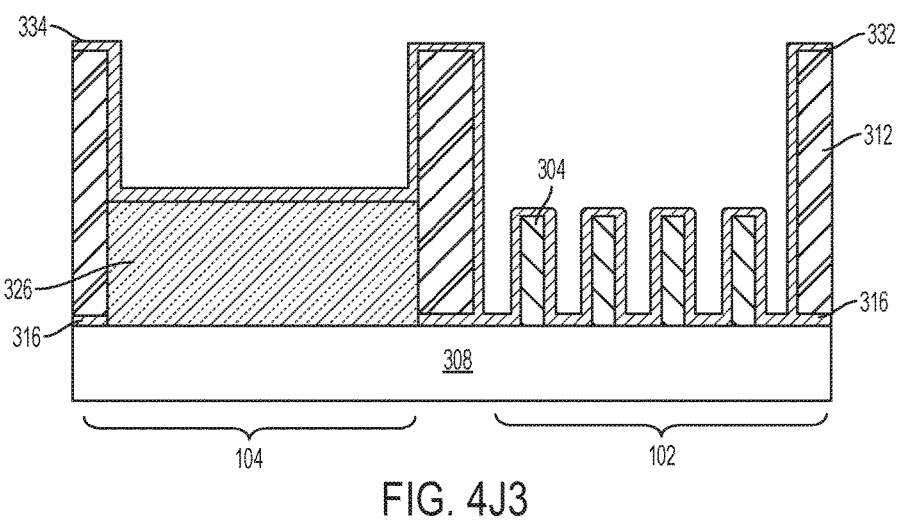
FIG. 4J3

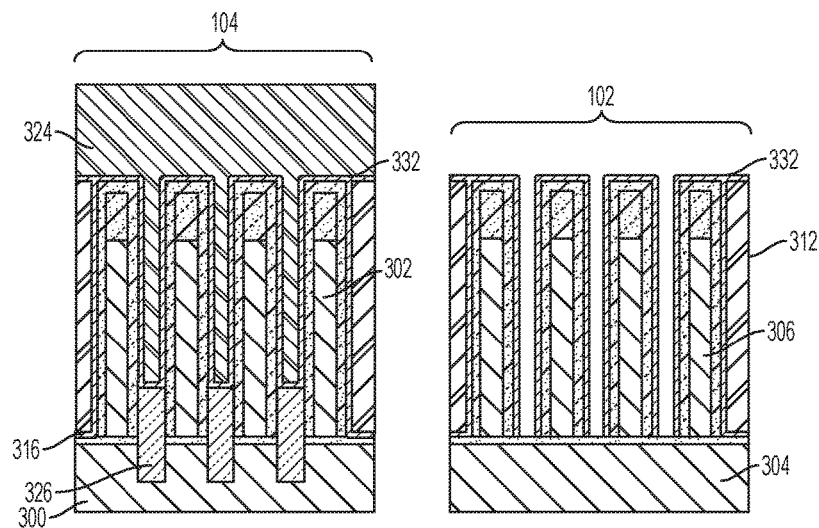
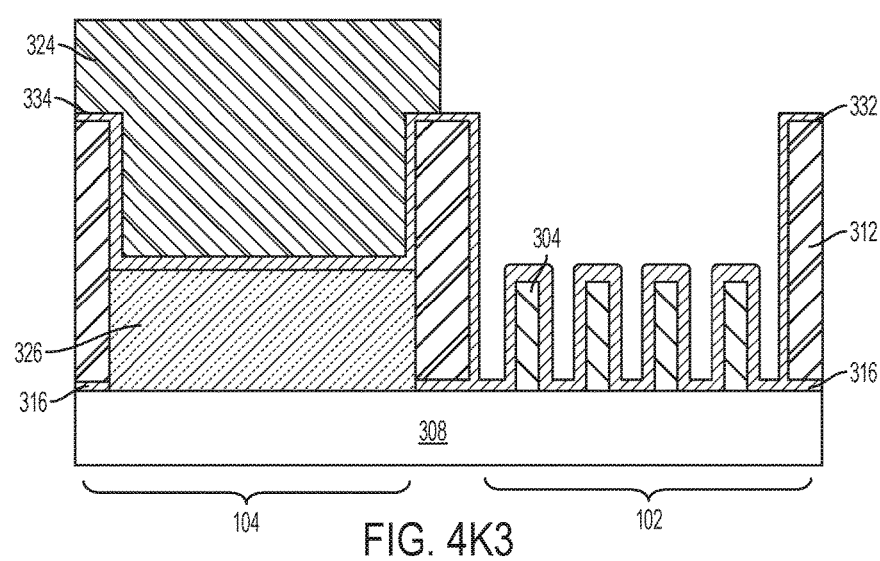

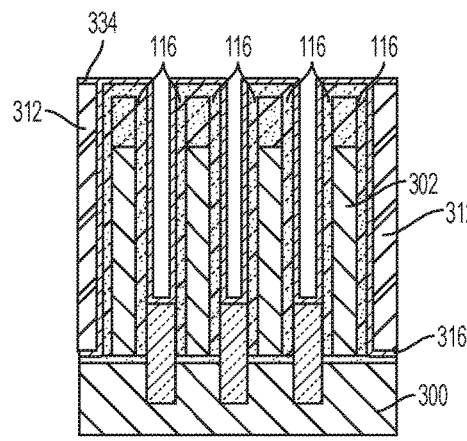
FIG. 4L1
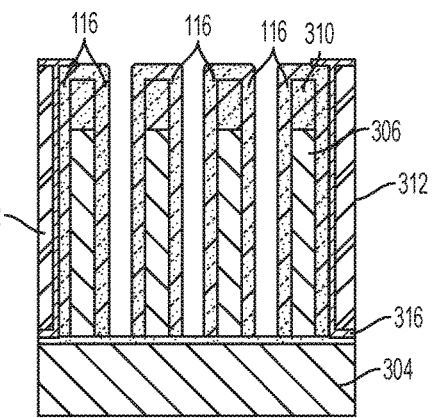
FIG. 4L2
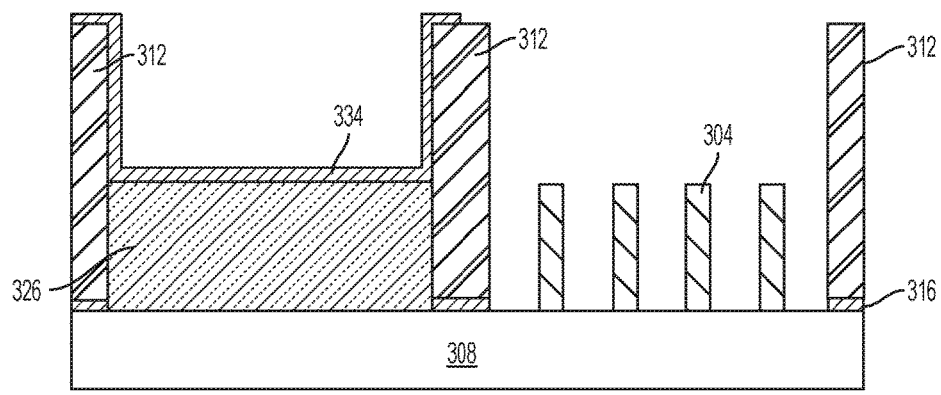
FIG. 4L3

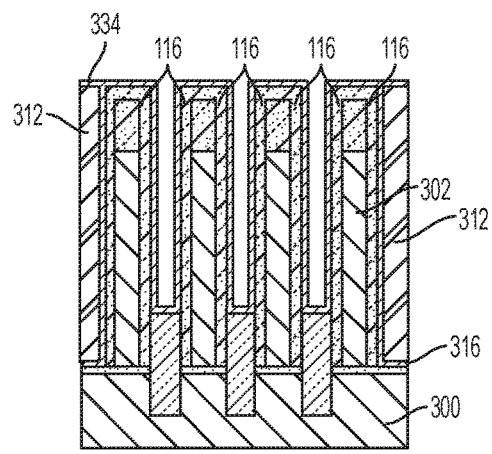
FIG. 4M1
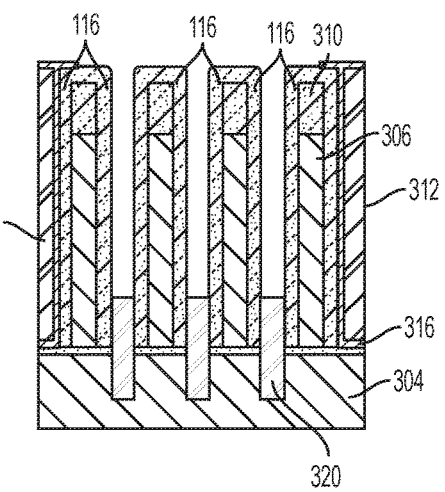
FIG. 4M2
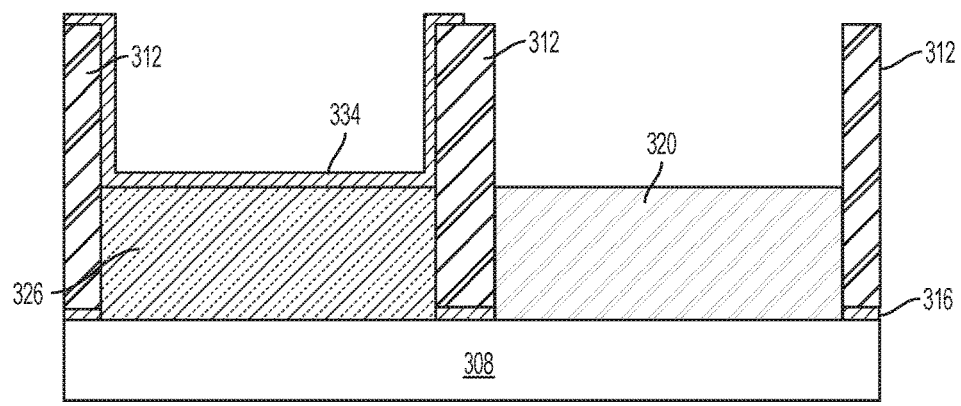
FIG. 4M3

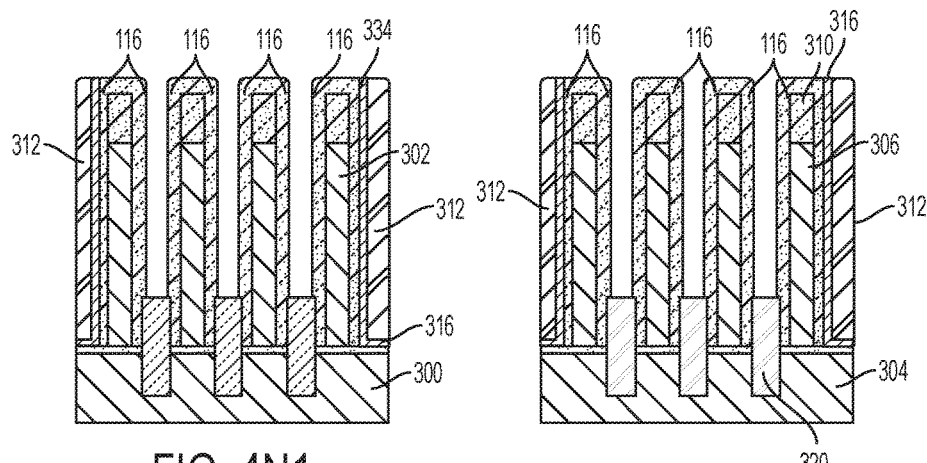
FIG. 4N1
FIG. 4N2
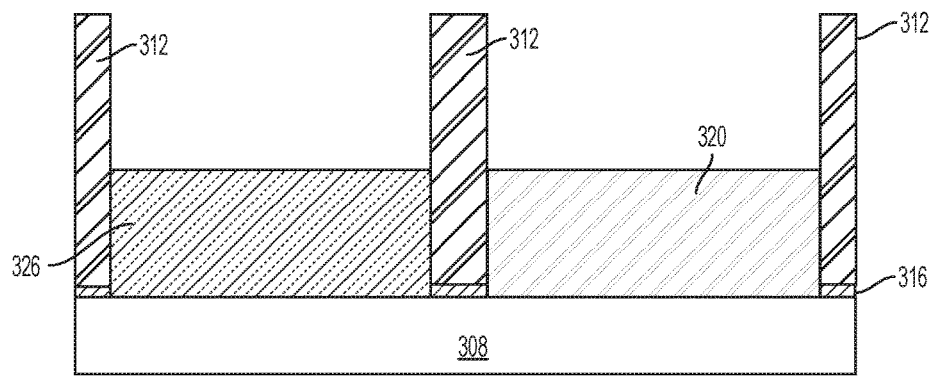
FIG. 4N3

SPACER FOR DUAL EPI CMOS DEVICES

DOMESTIC PRIORITY

This application is a Divisional of U.S. patent application Ser. No. 14/966,495, filed Dec. 11, 2015 entitled "SPACER FOR DUAL EPI CMOS DEVICES," the contents of which in its entirety are incorporated by reference.

BACKGROUND

The present invention relates to Complementary Metal Oxide Semiconductor (CMOS) devices, and more specifically, spacer formation in dual epitaxial (epi) growth CMOS applications.

CMOS is heavily used in the manufacture of integrated circuits. A typical CMOS device includes two types of transistors, a P-type metal-oxide-semiconductor field effect transistor (MOSFET) (PFET) and an N-type MOSFET (NFET).

Three-dimensional semiconductor devices, such as fin-type semiconductor devices (referred to as finFETs), typically include dielectric gate spacers formed on sidewalls of the gate stack to isolate the gate stack from the adjacent source/drain (S/D) regions.

In the fabrication of semiconductor devices on semiconductor wafers, the designed specifications of the devices may not always be achieved when the final devices are formed. As CMOS devices are scaled down, dual source-drain epitaxial (epi) deposition process can be implemented to enhance carrier mobility and improve device performance. However, the scaling of next generation technology has resulted in problems. For example, the conventional process scheme requires overlap of the N-FET transistor and P-FET transistor to avoid dual spacer etch and resulting epitaxial nodule defects. Moreover, there is no reliable overlap for mid-ultraviolet (MUV) lithography. In addition, conventional dual epi processes can lead to differing spacer thicknesses on the PFET and NFET. Such uneven spacing, for example a thicker NFET spacer, can degrade device performance. Moreover, differing middle of the line (MOL) spacer gaps that can result in conventional dual epi processes are not compatible with 7 nanometer (7 NM) technology nodes currently in demand.

SUMMARY

According to an embodiment of the present disclosure, a method for making a semiconductor includes patterning a first transistor having one or more gate stacks on a first source-drain area and second transistor comprising one or more gate stacks on a second source-drain area. The method also includes forming wet etch resistant dielectric spacers on gate stack side walls. The method also includes depositing a first nitride liner on the first and second transistors. The method also includes masking the second transistor and etching to remove the first nitride material from the spacer from the first source-drain area. The method also includes growing a first epitaxial layer on the source-drain area of the first transistor by an epitaxial growth process. The method also includes optionally removing the first nitride liner from second transistor and then depositing a second nitride liner on the first and second transistors. The method also includes masking the first transistor and etching to remove the second nitride material from the second transistor fins and growing a second epitaxial layer on the source-drain area of the second transistor by an epitaxial growth process.

According to another embodiment of the disclosure, a method for making a semiconductor includes patterning a first transistor comprising two or more first gate stacks on a first source-drain area and second transistor comprising two or more second gate stacks on a second source-drain area. The method also includes depositing a wet etch resistant spacer material on the first and second transistors and performing anisotropic spacer reactive ion etch to form spacer on the first and second transistors and remove spacer from first and second transistor fin regions. The method also includes depositing a first nitride liner on the first and second transistor spacers. The method also includes depositing a dielectric layer on the first nitride layer and planarizing the dielectric layer. The method also includes selectively removing the dielectric layer from between the first and second transistor spacers and source drain fins. The method also includes depositing a second nitride liner on the first and second transistors and selectively removing the second nitride liner from the first transistor. The method also includes growing a first epitaxial layer on the first source-drain area by an epitaxial growth process. The method also includes depositing a third nitride liner on the first and second transistors and selectively removing the third nitride liner from the second transistor. The method also includes growing a second epitaxial layer on the second source drain by an epitaxial growth process.

According to yet another embodiment of the present disclosure, a semiconductor device includes a first transistor having one or more first gate stacks on a first source-drain area insulating layer. The semiconductor device also includes a second transistor having one or more second gates stacks on a second source-drain area first insulating layer. The semiconductor device also includes a first spacer on opposing sides of each first gate stack having a first spacer thickness. The semiconductor device also includes a second spacer on opposing sides of each second gate stack having a second spacer thickness. The semiconductor device also includes a first epitaxial layer on the first source-drain area insulator layer and a second epitaxial layer on the second source-drain area insulator layer. The semiconductor device has a first spacer thickness that is equal to the second spacer thickness.

BRIEF DESCRIPTION OF THE DRAWINGS

FIGS. 2A-L illustrate an exemplary method of making a CMOS device according to a first embodiment of the disclosure, in which:

FIG. 2A is a cross-sectional side view of NFET (first transistor) and PFET (second transistor) gates lined with a spacer on a source-drain area;

FIG. 2B is a cross-sectional side view after forming dielectric spacers along gate sidewalls;

FIG. 2C is a cross-sectional side view after depositing a first nitride liner over the first and second transistor;

FIG. 2D is a cross-sectional side view after covering the NFET transistor with a mask;

FIG. 2E is a cross-sectional side view after etching the first nitride liner and spacer on the PFET transistor;

FIG. 2F is a cross-sectional side view after growing a first epitaxial layer on the PFET source-drain area;

FIG. 2G is a cross-sectional side view after removing the first nitride liner;

FIG. 2H is a cross-sectional side view after depositing a second nitride liner;

FIG. 2I is a cross-sectional side view after covering the PFET transistor with a mask;

FIG. 2J is a cross-sectional side view after etching the second nitride liner and spacer on the NFET transistor;

FIG. 2K is a cross-sectional side view after growing a second epitaxial layer on the NFET source-drain area;

FIG. 2L is a cross-sectional side view after removing the nitride liner;

FIGS. 3A-Y illustrate an exemplary method of making a CMOS device according to a second embodiment of the disclosure, in which:

FIG. 3A is a top down view of NFET (first transistor) and PFET (second transistor) fins of a CMOS device;

FIGS. 3B1 and 3B2 are cut-away views (across gates) of the device of FIG. 3A taken across lines A and B, respectively;

FIG. 3C is a cut-away view (across fins) of the device of FIG. 3A, taken across line C.

FIGS. 3D1 and 3D2 are cut-away views of the device of FIG. 3A taken across lines A and B, respectively, after deposition of a dielectric layer;

FIG. 3E is a cut-away view of the device of FIG. 3A, taken across line C, after deposition of a dielectric layer.

FIGS. 3F1 and 3F2 are cut-away views of the device of FIG. 3A taken across lines A and B, respectively, after photo resist patterning a source-drain contact opening;

FIG. 3G is a cut-away view of the device of FIG. 3A, taken across line C, after photo resist patterning a source-drain contact opening;

FIGS. 3H1 and 3H2 are cut-away views of the device of FIG. 3A taken across lines A and B, respectively, after etching and removal of the source-drain contact space;

FIG. 3I is a cut-away view of the device of FIG. 3A, taken across line C, after patterning and removal of source-drain contact space;

FIGS. 3J1 and 3J2 are cut-away views of the device of FIG. 3A taken across lines A and B, respectively, after etching and removal of portions of the spacer from fins;

FIG. 3K is a cut-away view of the device of FIG. 3A, taken across line C, after patterning and removal of portions of the spacer from fins;

FIGS. 3L1 and 3L2 are cut-away views of the device of FIG. 3A taken across lines A and B, respectively, after depositing a first nitride liner, blocking the NFET transistor, opening the PFET transistor with photo resist block material, and etching the first nitride liner away from the PFET transistor;

FIG. 3M is a cut-away view of the device of FIG. 3A, taken across line C, after depositing a first nitride liner, blocking the NFET transistor, opening PFET transistor with photo resist block material, and etching the first nitride liner away from away the PFET fins;

FIGS. 3N1 and 3N2 are cut-away views of the device of FIG. 3A taken across lines A and B, respectively, after removing block mask from NFET transistor and selectively growing an epitaxial layer on the PFET source-drain area;

FIG. 3O is a cut-away view of the device of FIG. 3A, taken across line C, after removing block mask from NFET transistor and selectively growing an epitaxial layer on the PFET source-drain areas;

FIGS. 3P1 and 3P2 are cut-away views of the device of FIG. 3A taken across lines A and B, respectively, after removing the first nitride liner;

FIG. 3Q is a cut-away view of the device of FIG. 3A, taken across line C, after removing the first nitride liner.

FIGS. 3R1 and 3R2 are cut-away views of the device of FIG. 3A taken across lines A and B, respectively, after depositing a second nitride liner;

FIG. 3S is a cut-away view of the device of FIG. 3A, taken across line C, after depositing a second nitride liner.

FIGS. 3T1 and 3T2 are cut-away views of the device of FIG. 3A taken across lines A and B, respectively, after blocking the PFET transistor, opening NFET transistor with photo resist block material, and etching the second nitride liner away from the NFET transistor;

FIG. 3U is a cut-away view of the device of FIG. 3A, taken across line C, after blocking the PFET transistor, and opening NFET transistor region with photo resist block material, and etching the second nitride liner away from the NFET fins;

FIGS. 3V1 and 3V2 are cut-away views of the device of FIG. 3A taken across lines A and B, respectively, after removing block material from PFET transistor and selectively growing a second epitaxial layer on the NFET source-drain area;

FIG. 3W is a cut-away view of the device of FIG. 3A, taken across line C, after removing block material from PFET transistor and selectively growing a second epitaxial layer on the NFET source-drain area;

FIGS. 3X1 and 3X2 are cut-away views of the device of FIG. 3A taken across lines A and B, respectively, after removing the second nitride liner with isotropic etching;

FIG. 3Y is a cut-away view of the device of FIG. 3A, taken across line C, after removing the second nitride liner;

FIGS. 4A-N illustrate an exemplary method of making a CMOS device according to a third embodiment of the disclosure, in which:

FIG. 4A1 is a cut-away view of a device as shown in FIG. 3A taken across line A, FIG. 4A2 is taken across line B, and FIG. 4A3 is taken across line C, illustrating the device after spacer etch.

FIG. 4B1 is a cut-away view of a device as shown in FIG. 3A taken across line A, FIG. 4B2 is taken across line B, and FIG. 4B3 is taken across line C, illustrating the device after deposition of a first nitride liner.

FIG. 4C1 is a cut-away view of a device as shown in FIG. 3A taken across line A, FIG. 4C2 is taken across line B, and FIG. 4C3 is taken across line C, illustrating the device after deposition of a dielectric layer and chemical mechanical planarization (CMP).

FIG. 4D1 is a cut-away view of a device as shown in FIG. 3A taken across line A, FIG. 4D2 is taken across line B, and FIG. 4D3 is taken across line C, illustrating the device after reverse source-drain patterning.

FIG. 4E1 is a cut-away view of a device as shown in FIG. 3A taken across line A, FIG. 4E2 is taken across line B, and FIG. 4E3 is taken across line C, illustrating the device after removal of portions of the dielectric layer and first nitride liner in source-drain areas regions;

FIG. 4F1 is a cut-away view of a device as shown in FIG. 3A taken across line A, FIG. 4F2 is taken across line B, and FIG. 4F3 is taken across line C, illustrating the device after deposition of a nitride cap;

FIG. 4G1 is a cut-away view of a device as shown in FIG. 3A taken across line A, FIG. 4G2 is taken across line B, and FIG. 4G3 is taken across line C, illustrating the device after blocking the PFET transistor, and opening NFET transistor with photo resist block mask;

FIG. 4H1 is a cut-away view of a device as shown in FIG. 3A taken across line A, FIG. 4H2 is taken across line B, and FIG. 4H3 is taken across line C, illustrating the device after selectively removing the nitride cap from the NFET transistor spacer material and the PFET transistor block mask;

FIG. 4I1 is a cut-away view of a device as shown in FIG. 3A taken across line A, FIG. 4I2 is taken across line B, and FIG. 4I3 is taken across line C, illustrating the device after growing an epitaxial layer on the NFET source-drain fins;

FIG. 4J1 is a cut-away view of a device as shown in FIG. 3A taken across line A, FIG. 4J2 is taken across line B, and FIG. 4J3 is taken across line C, illustrating the device after depositing a second nitride cap;

FIG. 4K1 is a cut-away view of a device as shown in FIG. 3A taken across line A, FIG. 4K2 is taken across line B, and FIG. 4K3 is taken across line C, illustrating the device after blocking the NFET transistor;

FIG. 4L1 is a cut-away view of a device as shown in FIG. 3A taken across line A, FIG. 4L2 is taken across line B, and FIG. 4L3 is taken across line C, illustrating the device after removing portions of the nitride liner from the PFET transistor and removing the NFET block material;

FIG. 4M1 is a cut-away view of a device as shown in FIG. 3A taken across line A, FIG. 4M2 is taken across line B, and FIG. 4M3 is taken across line C, illustrating the device after growing an epitaxial layer on the PFET source-drain area; and FIG. 4N1 is a cut-away view of a device as shown in FIG. 3A taken across line A, FIG. 4N2 is taken across line B, and FIG. 4N3 is taken across line C, illustrating the device after removing portions of the nitride liner from the device.

DETAILED DESCRIPTION

Figure 1:
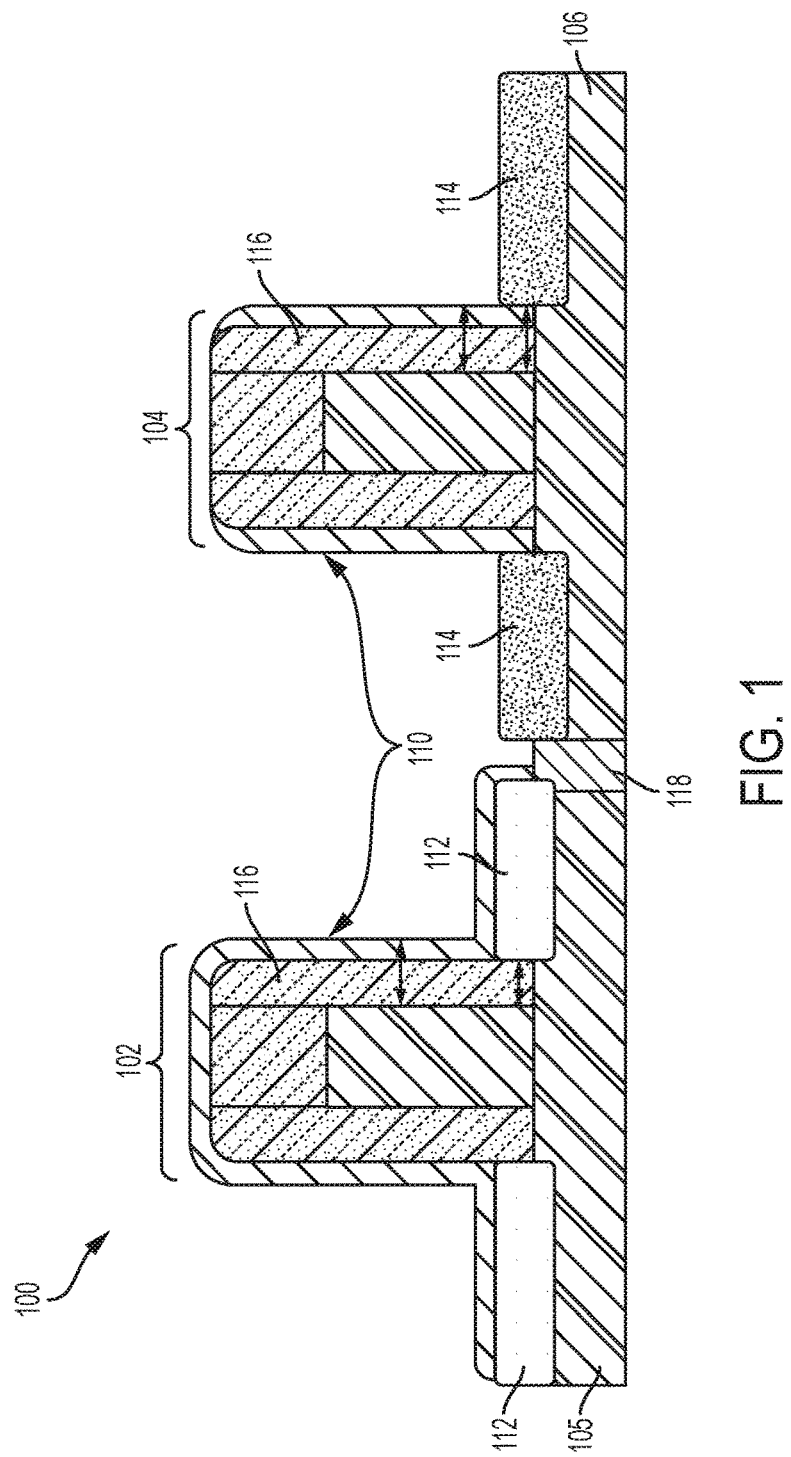
FIG. 1 is a cross-sectional side view of a CMOS device with dual-epitaxial regions fabricated in accordance with conventional methods.

Dual epitaxial processes for CMOS device manufacture can result in uneven spacer thicknesses, which potentially degrade device performance. Moreover, the middle of the line spacer gap between gates can vary. In accordance with the disclosure, methods are provided for dual epi CMOS device manufacture that can result in equal spacer thickness for NFET and PFET transistors.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value.

Yet, in another aspect, the term "about" means within 10, 9, 8, 7, 6, 5, 4, 3, 2, or 1% of the reported numerical value.

Turning now to the figures, FIG. 1 illustrates a cross-sectional side view of a CMOS device 100 with dual-epitaxial regions, 112 and 114, fabricated in accordance with conventional methods. PFET 102 and NFET 104 transistors are patterned on a substrate and covered by a spacer material 116. As illustrated, the PFET 102 spacer and NFET 104 spacer can have differing thicknesses when fabricated in accordance with conventional methods. For example, in the proximity of the NFET epitaxial region 114, the spacer is thicker than the spacer in the same location on the PFET epitaxial region 112.

With respect to FIG. 2, FIGS. 2A-2L illustrate an exemplary method for fabricating a semiconductor device in accordance with the disclosure. In one embodiment, as shown, the method relates to a semiconductor device where source-drain areas 105 and 106 are planar. In some embodiments, the method relates to non-planar semiconductor devices when source-drain area 105 is fin. The device includes a shallow trench isolation (STI) region 118. In some embodiments, for example, when the device is a finFET device, STI region 118 can be recessed. FIG. 2A illustrates a cross-sectional side view of a semiconductor device that can be built on insulator (SOI) substrate. In some embodiments, a semiconductor device can be built on a bulk Si substrate. An SOI wafer includes a thin layer of a semiconducting material atop an insulating layer (e.g., an oxide layer) which is in turn disposed on a silicon substrate. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. As shown, PFET 102 transistor and NFET 104 transistor are patterned on a substrate and positioned on source-drain areas 105 and 106. Gate 102 can be a sacrificial gate for replacement metal gate (RMG) if an active gate formation is achieved after source-drain epitaxial growth. In some embodiments, gate 102 can be formed as an active gate stack with an actual gate dielectric layer and work function metal before source-drain epitaxial growth. A sacrificial gate material can include, for example, a silicon material or dielectric material. After deposition of a sacrificial gate material a gate material can be planarized by chemical mechanical planarization (CMP). If the source-drain area corresponds to a nonplanar structure hard mask material 122 can be deposited on the sacrificial gate material. Gate stacks 120 can be formed by patterning with hard mask material 122 and transferring the pattern into the gate material.

Patterning can include, for example, a lithographic patterning and etching process such as, for example, reactive ion etching (ME). Lithography can include forming a photoresist (not shown) on a gate hard mask, exposing the photoresist to a desired pattern of radiation, and then developing the exposed photoresist with a resist developer using deep ultraviolet (DUV) or extreme ultraviolet (EUV) to provide a patterned photoresist on top of the sacrificial layer. Gate patterning for a gate pitch smaller than 80 nm can be achieved using multiple lithography and reactive ion etching (ME) or sidewall imaging transfer (SIT) patterning technique. At least one etch is employed to transfer the pattern from the patterned photoresist into the hard mask layer. The etching process may include a dry etch (e.g., reactive ion etching, plasma etching, ion beam etching, or laser ablation). After transferring the pattern, the patterned photoresist is removed utilizing resist stripping processes, for example, ashing. Ashing may be used to remove a photoresist material, amorphous carbon, or organic planarization (OPL) layer. Ashing is performed using a suitable reaction gas, for example, O2, N2, H2/N2, O3, CF4, or any combination thereof followed by wet clean, for example, with a sulfuric peroxide mixture.

Spacer material 116 includes a low-k spacer material. The low-k spacer material may contain Si, N, and at least one element selected from the group consisting of C and B. Additionally, the low-k spacer material may contain Si, N, B, and C. For example, the low-k spacer material may include SiBN, SiCN, SiBCN, or any combination thereof. The spacer material is selected to provide desired selectivity when etching the spacer material 116 versus a nitride liner material. Preferably, the spacer material is a wet etch resistant material. In one embodiment, the spacer material is SiBCN. The spacer material 116 is deposited as a layer of the low-k spacer material deposited on the device over the PFET transistor 102 and NFET transistor 104.

As shown in FIG. 2B, spacer material 116 is etched from the PFET transistor 102 and NFET transistor 104 to form dielectric spacers adjacent to the gate stacks 120 and expose source-drain areas 105 and 106. As shown in FIG. 2C, a first nitride liner 200 can then be deposited on the PFET transistor 102 and NFET transistor 104.

Next, as shown in FIG. 2D, one of the transistors is covered with a block resist material 202 to mask the transistor. Block resist material 202 can include, for example, a combination of organic planarizing layer (OPL), litho hard mask, and resist. In some embodiments, block resist material can include bottom anti-reflective coating (BARC) and then resist. In some embodiments, for instance as shown in FIG. 2D, the NFET transistor 104 is masked. In other embodiments, the PFET transistor 102 is masked. Next, as shown in FIG. 2F, a portion of the first nitride liner 200 from the exposed transistor block are removed. As depicted in FIG. 2F, the nitride liner can be is anisotropically etched using RIE or preferably isotropically completely removed using wet etch with hydrofluoric acid (HF) based chemistry, such as with hydrofluoric acide ethyl glycol, to remove the first nitride liner 200 from the source-drain area 105 of the PFET transistor 102.

Next, as shown in FIG. 2F, an epitaxial growth process can be performed to deposit a crystalline epitaxial layer 112 onto a source-drain area 105. The underlying source-drain area acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, silicon germanium doped with boron, or silicon carbon doped with phosphorous can be further doped with any p-type or n-type dopants using ion implant.

Next, the device is optionally etched to remove any remaining first nitride liner 200, as shown in FIG. 2G. For example, HF based wet etching with a material selective for nitride, such as HFEG, can remove the first nitride layer from the device. Next, as depicted in FIG. 2H, a second nitride liner 204 is deposited on the device. In some embodiments, the first nitride liner is not removed prior to depositing the second nitride liner 204.

Then, as shown in FIG. 2I, the transistor that contains the epi layer is covered with a blocking material 202 to mask the transistor. In some embodiments, for instance as shown in FIG. 2I, the PFET transistor is masked at this step. The blocking material 202 that is used to block the transistor containing the epi layer can be the same blocking material used to mask the transistor in the step depicted in FIG. 2D or can be a different blocking material.

Next, as shown in FIG. 2J, the method includes anistropically or isotropically etching the second nitride liner on the NFET transistor 104 to expose the source-drain area 106. In some embodiments, the etching is anistropic etching. Next, as shown at FIG. 2K, a second epitaxial layer 114 is grown on the device, such as on the NFET transistor 104 source-drain area 106. The second epitaxial layer 114 can include the same material as the first epitaxial layer or can include different material. For example, the second epitaxial layer can be phosphorous-doped silicon carbon.

After growth of the second epitaxial layer 114, any remaining nitride liner, including first nitride liner or second nitride liner, can be removed as shown in FIG. 2L. For example, HF based wet etch or another substance selective to nitride can be used.

FIGS. 3A-Z illustrate an exemplary method of making a CMOS device according to a second embodiment of the disclosure. FIG. 3A is a top down view of first transistor and second transistor fins of a CMOS device. First and second transistors are PFET and NFET or vice versa. Three cut-away views of the device can be taken along lines A, B, and C of FIG. 3A. FIGS. 3B1 and 3B2 are cut-away views of the device of FIG. 3A taken across lines A and B, respectively and FIG. 3C is a cut-away view of the device of FIG. 3A, taken across line C. As shown in FIGS. 3A-3C, the device includes an NFET transistor 104 and a PFET transistor 102. The NFET transistor 104 includes a plurality of parallel NFET gate stacks 302 including a hard mask 310 positioned perpendicularly to a plurality of NFET fins 300 formed on a substrate 308. The PFET transistor 102 includes a plurality of parallel NFET gate stacks 304 positioned perpendicularly to a plurality of PFET fins 304 formed on the substrate 308. The substrate 308 can be a SOI or bulk wafer as described above. The gate stacks 302, 306, fins 300, 304, and portions of the substrate 308 are covered by a spacer material 116, such as SiBCN.

In accordance with an embodiment, as shown in FIG. 3D-3E, a middle of the line (MOL) dielectric layer 312 is then deposited on the device on top of the spacer material 116. The dielectric layer can be any low dielectric constant material, including any dielectric constant K where K is less than 4, such as SiO2 or Si3N4. The dielectric layer 312 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

Next, the deposition of the Middle-of-line (MOL) dielectric layer can be followed by a planarization process, such as Chemical mechanical polishing (CMP) process.

Next, as shown in FIGS. 3F-3G, the method can include patterning and removing contact resist patterning 314. The contact patterning can be achieved using single exposure using EUV or a multiple DUV exposure followed by RIE for a gate pitch smaller than 80 nm. The contact resist patterning 314 can include OPL at bottom, followed by a layer of hard mask, and resist on top of the hard mask. In some embodiments, a reverse source-drain resist pattern is utilized, such as the pattern illustrated in FIG. 4S.

Next, after patterning of the block mask, a selective etching process can remove exposed portions of the dielectric layer 312 not covered by the contact resist patterning 314 as shown in FIGS. 3H-3I.

The method then includes, as shown at FIG. 3J-3K, removal of portions of the spacer, for example by etching, to expose portions of the NFET fin 300, PFET fin 304, and substrate 308.

Then, in accordance with the method and as shown at FIGS. 3L-M the method includes depositing a first nitride liner 316, such as silicon nitride (Si3N4), on the device, blocking one of the transistors with a first blocking material 318, such as the NFET transistor as depicted in FIGS. 3L-M, and then removing the first nitride liner 316 from the fins of the exposed transistor, such as the PFET transistor nitride liner around the PFET fins 304 as shown. The first nitride liner 316 can be removed by isotropic or anistropic etching. Preferably, the first nitride liner 316 is removed from the exposed transistor through isotropic etching.

In some embodiments of the disclosure, as shown in FIGS. 3N-3O, after lining one of the transistors with the first nitride liner 316 and removing the first nitride liner 316 from the other transistor, and then OPL blocking resist is removed from the NFET transistor by an ashing dry process or wet strip using sulfuric peroxide based chemistry. A first epitaxial layer 320 can be grown on the PFET source-drain area 304.

Optionally, as shown in FIGS. 3P-3Q, in some embodiments the first nitride liner can be removed from the device after the first nitride liner is removed and prior to depositing a second nitride liner.

Next, the method includes depositing a second nitride liner 322 on the device, as shown in FIGS. 3R-3S. The second nitride liner 322 can include the same material as the first nitride liner, or it can include different materials. The second nitride liner can, in some embodiments, be deposited on top of a first nitride liner. In some embodiments, the second nitride liner is deposited on the substrate 308, NFET fins 300, first epitaxial layer 320, and the NFET and PFET gates 302, 306 including the adjacent spacer materials 116, and the dielectric layer 312.

The method next includes, as shown in FIGS. 3T-3U, blocking the transistor that includes an epitaxial layer with a second resist or blocking material 324. As depicted, the PFET transistor 102 is the transistor that is blocked with the second blocking material 324. In embodiments where the NFET transistor is the transistor upon which the first epitaxial layer is grown, the NFET transistor is blocked with the second blocking material. Then the device is anistropically or isotropically etched, for example with lithographic patterning, to remove the second nitride layer 322 from the unblocked transistor, here the NFET transistor 104, exposing the substrate 308 and NFET fins 300.

Next, as shown in FIGS. 3V-3W, the method includes removing the NFET transistor blocking material 324 and then growing a second epitaxial layer 326 on the exposed transistor, here the NFET transistor 104, between the NFET gates 302.

Then, the method includes as shown in FIGs. FIG. 3X-3Y, removing any remaining nitride liner, including the second nitride liner and any first nitride liner remaining on the device.

FIGS. 4A-N illustrate an exemplary method of making a CMOS device according to a third embodiment of the disclosure. FIG. 4A1 is a cut-away view of a device as shown in FIG. 3A taken across line A, FIG. 4A2 is taken across line B, and FIG. 4A3 is taken across line C, illustrating a transistor device after a spacer material 116 is deposited on the device and then etched to expose NFET fin 300 and PFET fin 304 and substrate 308. Spacer 116 can be any wet etch resistant low-K material (dielectric constant, K<6). In some embodiments, spacer material 116 is SiBCN. Gates 302 and 306 can be formed with single lithographic exposure using EUV or a multiple combination of single or double DUV exposure followed by RIE or sidewall imaging transfer patterning technique.

Next, as shown in FIG. 4B a first nitride liner 316 can be deposited on the device. Nitride liner 316 can be silicon nitride (Si3N4), silicon oxide (SiO2) or any material that can be removed selectively from main first spacer material. In preferred embodiments, silicon nitride is used rather than silicon oxide because, for example, the wet etch rate by pre-cleaning for epitaxial deposition can be lower than that of silicon dioxide. Therefore, thin silicon nitride liner can be used for preventing epitaxial growth on the undesired source-drain fin area. It is an important property for tight gate pitch scaling. Then, as shown in FIG. 4C, the method includes depositing a low-K dielectric material 312 on the device and optionally planarizing the dielectric layer, for instance by CMP. Non-limiting examples of suitable materials for the dielectric layer 312 include silicon dioxide or any dielectric material with dielectric constant, k lower than 4. The dielectric material 312 can be deposited by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. In some embodiments, the dielectric material 312 is deposited by CVD.

Next, in accordance with the third embodiment as shown in FIG. 4D, a reverse source-drain patterning mask composed of a sacrificial layer 314 is patterned on the device. In some embodiments, contact patterning resist can be formed as illustrated, for example, in FIG. 3S. The pattern is such that subsequent etching can expose trenches between the NFET gates 302 and PFET gates 306, as depicted in FIG. 4E. During this process the nitride liner 316 can, in some embodiments, be removed in the opening regions.

Optionally, as shown in FIG. 4F, the method next includes depositing a nitride cap 332, such as a S3iN4 cap, on the etched device. For example, a nitride cap 332 can potentially protect the structure from damage received during etching processes.

Next, as shown in FIG. 4G, the method includes masking a first transistor, for instance the PFET transistor 102, with a first blocking material 318. Then, as shown in FIG. 4H, the nitride cap 332 is removed from the unblocked transistor, as shown the NFET transistor 104. Next, the first blocking material 318 is removed.

As shown in FIG. 4I, the method next includes growing an epitaxial layer 326 on the NFET fins 104. Thereafter, optionally a second nitride cap 334 is deposited on the device, as shown in FIG. 4J. The second nitride cap 334 can be the same material as the nitride cap 332, or can be a different nitride material. In some embodiments, a first nitride liner can be selectively removed at this step.

Next, as shown in FIG. 4K, the method includes masking the second transistor, as shown the NFET 104 transistor, with a second blocking material 324. Then, as shown in FIG. 4L, the nitride liner 334 is anistropically or isotropically etched from the PFET transistor. The second blocking material 324 is removed from the device.

Then, the method includes growing an epitaxial layer 320 on the PFET transistor 102, as shown in FIG. 4M. Next, as shown in FIG. 4N, the method includes removing any remaining nitride from the device. As illustrated in FIGS. 4M and 4N, epitaxial layer can be a flat layer, for example when it is merged.

In some embodiments, PFET 102 is a first transistor and NFET 104 is a second transistor. The first and second transistors are different transistors. The fins 110 within each transistor (NFET 104 and PFET 102), in some embodiments, can be arranged in a fin array. Each first or second transistor can include one fin, two fins, or an array of fins.

Non-limiting examples of suitable semiconductor substrate 100 materials include silicon, germanium, gallium arsenide, silicon germanium, indium arsenide, or any combination thereof.

According to one embodiment of the present disclosure, a method of making a semiconductor includes patterning a first transistor comprising two or more gate stacks on a first source-drain area and second transistor comprising two or more gate stacks on a second source-drain area. The method also includes depositing a wet etch resistant spacer material on the first and second transistors. The method also includes depositing a dielectric layer on the first nitride layer and planarizing the dielectric layer. The method also includes opening and selectively removing the dielectric layer from between a first transistor fin region and a second transistor fin region. The method also includes removing the spacer material from the first and second source-drain areas between the gate stacks with isotropic reactive ion etching. The method also includes depositing a first nitride liner on the first and second transistors and selectively removing the first nitride liner from the first transistor. The method also includes growing a first epitaxial layer on the first source-drain area by an epitaxial growth process. The method also includes depositing a second nitride liner on the first and second transistors and selectively removing the third nitride liner from the second transistor. The method also includes growing a second epitaxial layer on the second source-drain area by an epitaxial growth process. The method also includes selectively removing the second nitride liner from the first transistor to form a dual epitaxial transistor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
a first semiconductor structure having one or more first gate stacks on an upper surface of a first semiconductor fin that includes a first source-drain area having a horizontal surface on an upper surface of the first source-drain area;
a second semiconductor structure having one or more second gates stacks on an upper surface of a second semiconductor fin that includes a second source-drain area having a horizontal surface on an upper surface of the second source-drain area;
a first spacer on opposing sides of each first gate stack, the first spacer directly disposed on the upper surface of the first semiconductor fin and having a first spacer thickness;
a second spacer on opposing sides of each second gate stack, the second spacer directly disposed on the upper surface of the second semiconductor fin and having a second spacer thickness;
a first flat layer directly disposed on the upper surface of the first semiconductor fin, the first flat layer comprising at least one merged crystalline epitaxial layer disposed on opposing sides of the first source-drain area directly adjacent to a surface of the first spacer opposite the one or more first gate stacks, the first epitaxial layer extending the length of the first source-drain area and covering the horizontal surface of the first source-drain area except areas covered by the one or more first gate stacks; and
a second flat layer directly disposed on the upper surface of the second semiconductor fin, the second flat layer comprising at least one merged crystalline epitaxial layer disposed on opposing sides of the second source-drain area directly adjacent to a surface of the second spacer opposite the one or more second gate stacks;
wherein the first spacer thickness is equal to the second spacer thickness, and
wherein a bottom surface of the first epitaxial layer extends below a bottom of the first gate stacks and a bottom surface of the second epitaxial layer extends below a bottom of the second gate stacks.

2. The semiconductor device according to claim 1, wherein the first spacer and the second spacer comprise SiBCN.

3. The semiconductor device according to claim 1, comprising a dielectric layer between a first crystalline epitaxial layer and a second crystalline epitaxial layer among the at least one merged crystalline epitaxial layer.

4. The semiconductor device according to claim 3, wherein the dielectric layer comprises a low-k dielectric material.

* * * * *